United States Patent
Kyono et al.

(10) Patent No.: US 8,731,016 B2
(45) Date of Patent: May 20, 2014

(54) NITRIDE SEMICONDUCTOR LIGHT EMITTING DEVICE

(71) Applicants: Sumitomo Electric Industries, Ltd., Osaka (JP); Sony Corporation, Tokyo (JP)

(72) Inventors: Takashi Kyono, Osaka (JP); Yohei Enya, Itami (JP); Masaki Ueno, Itami (JP); Katsunori Yanashima, Kanagawa (JP); Kunihiko Tasai, Tokyo (JP); Hiroshi Nakajima, Kanagawa (JP); Noriyuki Futagawa, Kanagawa (JP)

(73) Assignees: Sumitomo Electric Industries, Ltd., Osaka-shi (JP); Sony Corporation, Tokyo (JP)

( * ) Notice: Subject to any disclaimer, the term of this patent is extended or adjusted under 35 U.S.C. 154(b) by 22 days.

(21) Appl. No.: 13/658,239

(22) Filed: Oct. 23, 2012

(65) Prior Publication Data

US 2013/0142210 A1 Jun. 6, 2013

Related U.S. Application Data

(60) Provisional application No. 61/559,510, filed on Nov. 14, 2011.

(30) Foreign Application Priority Data

Oct. 24, 2011 (JP) .................................. 2011-233165

(51) Int. Cl.
*H01S 5/00* (2006.01)

(52) U.S. Cl.
USPC .................. 372/43.01; 372/44.01; 372/45.01; 372/45.012; 372/46.01; 372/50.1

(58) Field of Classification Search
USPC ......... 372/43.01, 44.01, 45.01, 45.012, 46.01
See application file for complete search history.

(56) References Cited

U.S. PATENT DOCUMENTS 6,046,464 A * 4/2000 Schetzina ........................ 257/96
2004/0124500 A1* 7/2004 Kawagoe ....................... 257/548

FOREIGN PATENT DOCUMENTS

JP 2008-177624 A 7/2008
JP 2012-124273 A 6/2012

(Continued)

OTHER PUBLICATIONS

Notice of Allowance in Japanese Patent Application No. 2011-233165, dated Mar. 26, 2013.

(Continued)

*Primary Examiner* — Dung Nguyen
(74) *Attorney, Agent, or Firm* — Venable LLP; Michael A. Sartori

(57) ABSTRACT

A nitride semiconductor light-emitting device has a semiconductor ridge, and includes a first inner-layer between an active layer and an n-type cladding and a second inner-semiconductor layer between the active layer and a p-type cladding. The first inner-layer, active layer and second inner-layer constitute a core-region. The n-type cladding, core-region and p-type cladding constitute a waveguide-structure. The active layer and the first inner-layer constitute a first heterojunction inclined at an angle greater than zero with respect to a reference plane of the c-plane of the nitride semiconductor of the n-type cladding. Piezoelectric polarization of the well layer is oriented in a direction from the p-type cladding toward the n-type cladding. The second inner-layer and InGaN well layer constitute a second heterojunction. A distance between the ridge bottom and the second heterojunction is 200 nm or less. The ridge includes a third heterojunction between the second inner-layer and the p-type cladding.

20 Claims, 9 Drawing Sheets

(56) References Cited

FOREIGN PATENT DOCUMENTS

| | | |
|---|---|---|
| JP | 2013-041978 A | 2/2013 |
| WO | WO-2010/147181 A1 | 12/2010 |
| WO | WO-2011/007777 A1 | 1/2011 |
| WO | WO-2011/040486 A1 | 4/2011 |

OTHER PUBLICATIONS

Hirokuni Asamizu et al., "Continuous-Wave Operation of InGaN/GaN Laser Diodes on Semipolar (1122) Plane Gallium Nitrides," Applied Physics Express, vol. 2, No. 2, Feb. 13, 2009, pp. 021002-1-021002-3.

International Search Report in International Patent Application No. PCT/JP2012/066055, dated Jul. 31, 2012.

\* cited by examiner

Fig.4
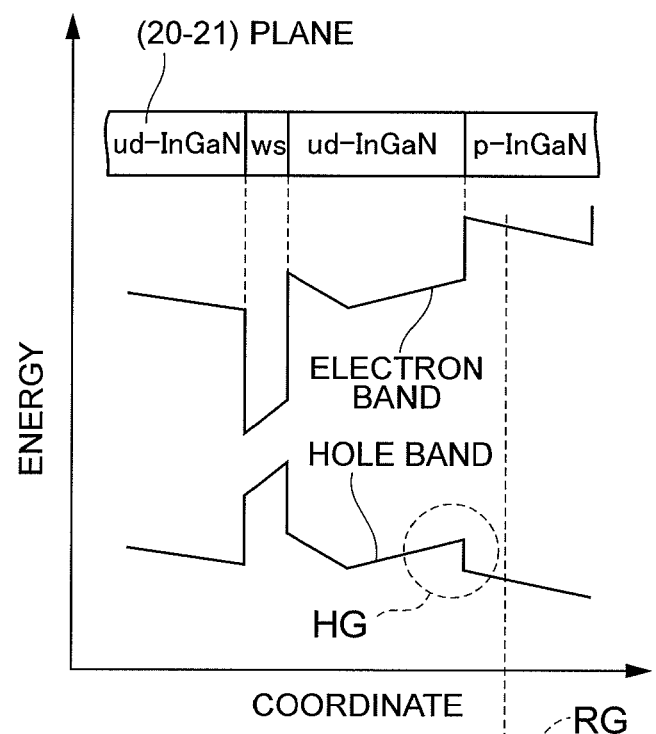
(a)
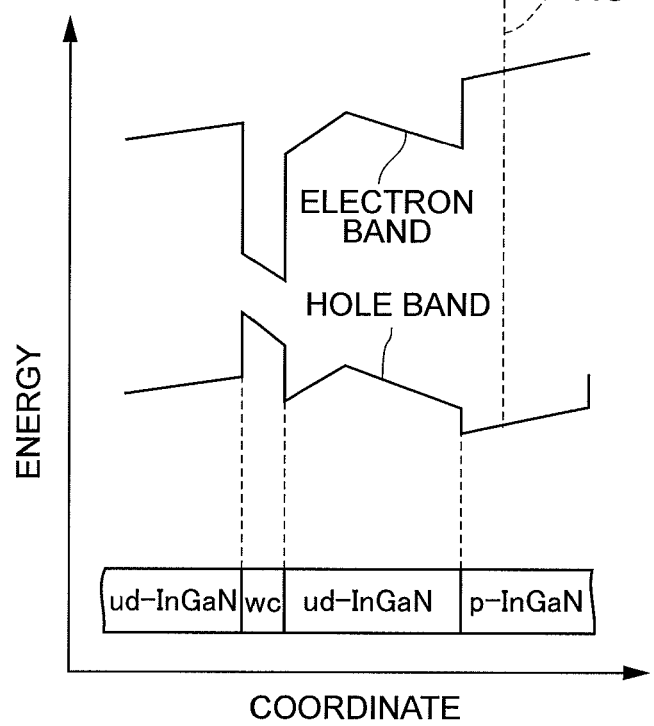
(b)

NITRIDE SEMICONDUCTOR LIGHT EMITTING DEVICE

CROSS REFERENCE TO RELATED APPLICATIONS

This application is related to and claims priority under 35 U.S.C. 119 to U.S. provisional patent application No. 61/559,510, filed Nov. 14, 2011, entitled "NITRIDE SEMICONDUCTOR LIGHT EMITTING DEVICE."

BACKGROUND OF THE INVENTION

1. Field of the Invention

The present invention relates to a nitride semiconductor light emitting device.

2. Related Background Art

Patent Literature 1 relates to a gallium nitride semiconductor laser device. The gallium nitride semiconductor laser device comprises an active layer of a multiple quantum well structure which is composed of a nitride semiconductor and which includes two quantum well layers. Each well layer has a thickness of 10 nm or less, and accordingly electrons and holes can be uniformly distributed over all quantum well layers. Hence, after electrons and holes have been recombined with each other into annihilation in the quantum well layers, new electrons and holes are effectively injected thereinto, so that the densities of the electrons and holes in the quantum well layers can be modulated effectively. The optical output can also be modulated therewith, and the gallium nitride semiconductor laser device is provided which prevents errors from occurring in data readout when used for an optical disk.

Patent Literature 1: Japanese Patent Application Laid-open No. 2008-177624

SUMMARY OF THE INVENTION

Patent Literature 1 discloses a gallium nitride semiconductor laser device. A gallium nitride semiconductor laser device is fabricated using a sapphire substrate, a SiC substrate, a spinel substrate, a MgO substrate, a Si substrate or a GaAs substrate. When fabricating the gallium nitride semiconductor laser device, a semiconductor layer for the laser is grown on a polar c-plane semiconductor provided on the substrate. At the end of the epitaxial growth, a p-type cladding layer of a thickness of 0.7 μm and a contact layer of a thickness of 0.2 μm are grown thereon. Subsequently, the p-type contact layer and the p-type cladding layer are etched to form a ridge structure. An optical guiding layer is not etched in the formation of the ridge. In the ridge structure, a thickness of the remaining p-type cladding layer after etching ranges from 0.05 μm to 0.5 μm.

In a nitride semiconductor laser in which an active layer is provided on a semipolar plane, the present inventors have found that, when a piezoelectric polarization of a well layer on the semipolar plane is negative, in other words, when the piezoelectric polarization is opposite to a piezoelectric polarization of a well layer of a nitride semiconductor laser formed on a c-plane, a difference in semiconductor laser characteristics arises between these nitride semiconductor lasers. In regards to a nitride semiconductor laser having a ridge structure fabricated on a semipolar plane, an experiment conducted by the present inventors has shown that a threshold current of a nitride semiconductor laser using a semipolar plane is larger than a threshold current of a nitride semiconductor laser using a c-plane. This suggests that, in a semiconductor ridge fabricated on a semipolar plane in which a piezoelectric polarization of a well layer is oriented in a direction from a p-type cladding layer toward an n-type cladding layer, a spread of carriers from the semiconductor ridge in the lateral direction is greater compared with a semiconductor ridge provided on a c-plane.

According to findings by the present inventors, techniques of c-plane nitride semiconductor lasers are often inapplicable to semipolar plane nitride semiconductor lasers, of which technique pertaining to an inverse piezoelectric polarization is a case in point.

It is an object of the present invention to provide a nitride semiconductor light emitting device having a structure capable of reducing a lateral spread of carriers flowing from a semiconductor ridge.

A nitride semiconductor light emitting device according to one aspect of the present invention comprises (a) a first group III nitride semiconductor region including an n-type cladding layer and a first inner semiconductor layer, (b) an active layer provided on the first inner semiconductor layer of the first group III nitride semiconductor region, (c) a second group III nitride semiconductor region which includes a p-type cladding layer and a second inner semiconductor layer and which is provided on the active layer, and (d) an electrode provided on the second group III nitride semiconductor region. The first group III nitride semiconductor region, the active layer, and the second group III nitride semiconductor region are arranged in this order along a given stacking axis; the first inner semiconductor layer is provided between the active layer and the n-type cladding layer; the second inner semiconductor layer is provided between the active layer and the p-type cladding layer; the first inner semiconductor layer, the active layer, and the second inner semiconductor layer constitute a core region; the n-type cladding layer, the core region, and the p-type cladding layer constitute an optical waveguide structure; the active layer and the first inner semiconductor layer of the first group III nitride semiconductor region constitute a first heterojunction; the n-type cladding layer comprises a group III nitride semiconductor; the first heterojunction is inclined by an angle of inclination of greater than zero with respect to a reference plane that extends along a c-plane of the group III nitride semiconductor of the n-type cladding layer; the active layer includes a well layer which comprises a gallium nitride semiconductor and which includes a compressive strain, a piezoelectric polarization of the well layer is oriented in a direction from the p-type cladding layer toward the n-type cladding layer, and the well layer includes an InGaN layer; the well layer of the active layer and the second inner semiconductor layer of the second group III nitride semiconductor region constitute a second heterojunction; the second group III nitride semiconductor region includes a semiconductor ridge; the semiconductor ridge includes a third heterojunction between the second inner semiconductor layer and the p-type cladding layer; the second inner semiconductor layer includes a first portion that forms the second heterojunction with the well layer of the active layer, a second portion extending from the third heterojunction to a bottom of the semiconductor ridge, and a third portion between the first portion and the second portion; the first portion, the third portion, and the second portion are arranged in this order along the stacking axis; and a distance between the bottom of the semiconductor ridge and the second heterojunction is 200 nm or less.

According to the above-described nitride semiconductor light emitting device, the active layer forms a heterojunction (a first heterojunction) with the first inner semiconductor layer of the first group III nitride semiconductor region, and the heterojunction is inclined at an angle of inclination with respect to a reference plane extending along a c-plane of the group III nitride semiconductor of the n-type cladding layer, and the angle of inclination is greater than zero. Accordingly, the active layer is provided on a so-called semipolar plane. When the active layer includes a well layer containing a compressive strain and a semiconductor ridge is fabricated on a semipolar plane in which a piezoelectric polarization of the well layer is oriented in a direction from a p-type cladding layer toward an n-type cladding layer, a lateral spreading of carriers originating from the semiconductor ridge is greater compared with a lateral spreading of carriers originating from a semiconductor ridge provided on a c-plane. When the distance between the bottom of the semiconductor ridge and the second heterojunction is 200 nm or less, an increase of the lateral spreading of carriers from the semiconductor ridge is reduced and waveguide loss resulting from a mismatch between a light distribution and a carrier distribution in the optical waveguide structure can be also reduced, thereby reducing an increase in threshold current.

Moreover, favorably, the distance between the bottom of the semiconductor ridge and the second heterojunction is 30 nm or more. When the distance between the bottom of the semiconductor ridge and the second heterojunction falls below 30 nm, the processing of ridge formation may deteriorate the active layer to cause the deterioration in luminous efficiency.

In addition, a nitride semiconductor light emitting device according to another aspect of the present invention comprises: (a) a first group III nitride semiconductor region including an n-type cladding layer and a first inner semiconductor layer; (b) an active layer provided on the first inner semiconductor layer in the first group III nitride semiconductor region; (c) a second group III nitride semiconductor region which includes a p-type cladding layer and a second inner semiconductor layer and which is provided on the active layer; and (d) an electrode provided on the second group III nitride semiconductor region. The first group III nitride semiconductor region, the active layer, and the second group III nitride semiconductor region are arranged in this order along a given stacking axis; the first inner semiconductor layer is provided between the active layer and the n-type cladding layer; the second inner semiconductor layer is provided between the active layer and the p-type cladding layer; the active layer and the first inner semiconductor layer of the first group III nitride semiconductor region constitute a first heterojunction, the n-type cladding layer comprises a group III nitride semiconductor; the first heterojunction is tilted at an angle of inclination of greater than zero with respect to a reference plane that extends along a c-plane of the group III nitride semiconductor of the n-type cladding layer; the active layer includes a well layer which comprises a gallium nitride semiconductor and which contains a compressive strain, a piezoelectric polarization of the well layer is oriented in a direction from the p-type cladding layer toward the n-type cladding layer; the active layer and the second inner semiconductor layer of the second group III nitride semiconductor region constitute a second heterojunction; the second group III nitride semiconductor region includes a semiconductor ridge; the semiconductor ridge includes a third heterojunction between the second inner semiconductor layer and the p-type cladding layer; the second inner semiconductor layer includes a first portion which is located within 80 nm from the second heterojunction as defined in the direction of the stacking axis and which forms the second heterojunction with the active layer, a second portion which is from the third heterojunction to a bottom of the semiconductor ridge, and a third portion between the first portion and the second portion; the first portion, the third portion, and the second portion are arranged in this order along the stacking axis; and the third portion of the second inner semiconductor layer includes no heterojunction.

According to the above-described nitride semiconductor light emitting device, the active layer forms a heterojunction (a first heterojunction) with the first inner semiconductor layer of the first group III nitride semiconductor region, and the heterojunction is inclined at an angle of inclination of greater than zero with respect to a reference plane extending along a c-plane of the group III nitride semiconductor of the n-type cladding layer. The active layer is, therefore, provided on a so-called semipolar plane. When the active layer includes a well layer containing a compressive strain and a semiconductor ridge is fabricated on a semipolar plane orientation in which a piezoelectric polarization of the well layer is oriented in a direction from a p-type cladding layer toward an n-type cladding layer, a horizontal spread of carriers originating from the semiconductor ridge is greater compared to a horizontal spread of carriers from a semiconductor ridge provided on a c-plane.

The present inventors have investigated a structure in which the active layer forms a heterojunction (a second heterojunction) with the second inner semiconductor layer, and have found that the semiconductor ridge in the second group III nitride semiconductor region includes a heterojunction (a third heterojunction) formed between the second inner semiconductor layer and the p-type cladding layer, the third portion of the second inner semiconductor layer, in other words, a semiconductor portion from 80 nm away from the second heterojunction in the direction of the stacking axis to the bottom of the semiconductor ridge does not include any heterojunction. When this semiconductor portion does not include any heterojunction, the horizontal spreading of carriers due to a dip in the hole band is suppressed and hence a mismatch between a light distribution and a carrier distribution is reduced, so that an increase in threshold current is reduced.

Furthermore, a nitride semiconductor light emitting device according to yet another aspect of the present invention comprises: (a) a first group III nitride semiconductor region including an n-type cladding layer and a first inner semiconductor layer; (b) an active layer provided on the first inner semiconductor layer in the first group III nitride semiconductor region; (c) a second group III nitride semiconductor region which includes a p-type cladding layer and a second inner semiconductor layer and which is provided on the active layer; and (d) an electrode provided on the second group III nitride semiconductor region. The first group III nitride semiconductor region, the active layer, and the second group III nitride semiconductor region are arranged in this order along a given stacking axis; the first inner semiconductor layer is provided between the active layer and the n-type cladding layer; the second inner semiconductor layer is provided between the active layer and the p-type cladding layer; the active layer and the first inner semiconductor layer of the first group III nitride semiconductor region constitute a first heterojunction, the n-type cladding layer is formed of a group III nitride semiconductor; the first heterojunction is inclined at an angle of inclination with respect to a reference plane that extends along a c-plane of the group III nitride semiconductor of the n-type cladding layer, the angle of inclination being greater than zero; the active layer includes a well layer which comprises a gallium nitride semiconductor and which contains a compressive strain, a piezoelectric polarization of the well layer is oriented in a direction from the p-type cladding layer toward the n-type cladding layer; the active layer and the second inner semiconductor layer in the second group III nitride semiconductor region constitute a second heterojunction; the second group III nitride semiconductor region includes a semiconductor ridge; the semiconductor ridge includes a third heterojunction between the second inner semiconductor layer and the p-type cladding layer; the second inner semiconductor layer includes a first portion which is within 80 nm from the second heterojunction as defined in the direction of the stacking axis and which forms the second heterojunction with the active layer, a second portion being from the third heterojunction to a bottom of the semiconductor ridge, and a third portion between the first portion and the second portion; the first portion, the third portion, and the second portion are arranged in this order along the stacking axis; the third portion of the second inner semiconductor layer does not include any heterojunction; the second inner semiconductor layer includes a first optical guiding layer and a second optical guiding layer; a band gap of the first optical guiding layer is greater than a band gap of the second optical guiding layer; the first optical guiding layer is provided between the p-type cladding layer and the second optical guiding layer; and the first optical guiding layer forms a heterojunction with the second optical guiding layer in the semiconductor ridge.

According to the nitride semiconductor light emitting device described above, the active layer forms a heterojunction (a first heterojunction) with the first inner semiconductor layer of the first group III nitride semiconductor region, and the heterojunction is inclined at an angle of inclination, which is greater than zero, with respect to a reference plane extending along a c-plane of the group III nitride semiconductor of the n-type cladding layer. Hence, the active layer is provided on a so-called semipolar plane. When the active layer includes a well layer containing a compressive strain, and a semiconductor ridge fabricated on a semipolar plane in which a piezoelectric polarization of the well layer is oriented in a direction from a p-type cladding layer toward an n-type cladding layer, a lateral spreading of carriers originating from the semiconductor ridge is greater compared to a lateral spreading of carriers from a semiconductor ridge provided on a c-plane.

According to the present inventors' analysis of a structure in which the active layer forms a heterojunction (a second heterojunction) with the second inner semiconductor layer, while the semiconductor ridge in the second group III nitride semiconductor region includes a heterojunction (a third heterojunction) between the second inner semiconductor layer and the p-type cladding layer, the third portion of the second inner semiconductor layer, in other words, a semiconductor portion from 80 nm away from the second heterojunction to the bottom of the semiconductor ridge as defined in the direction of the stacking axis does not include any heterojunction.

In addition, the optical confinement can be enhanced by a refractive index difference between the first optical guiding layer and the second optical guiding layer. The first optical guiding layer and the second optical guiding layer constitute a heterojunction and this heterojunction is located within the semiconductor ridge, and hence a dip in the hole band resulting from the heterojunction does not lead to a horizontal spread of the carriers from the semiconductor ridge to reduce an increase in threshold current.

Moreover, a nitride semiconductor light emitting device according to still another aspect of the present invention comprises: (a) a first group III nitride semiconductor region including an n-type cladding layer and a first inner semiconductor layer; (b) an active layer provided on the first inner semiconductor layer of the first group III nitride semiconductor region; (c) a second group III nitride semiconductor region which includes a p-type cladding layer and a second inner semiconductor layer and which is provided on the active layer; and (d) an electrode provided on the second group III nitride semiconductor region. The first group III nitride semiconductor region, the active layer, and the second group III nitride semiconductor region are arranged in this order along a given stacking axis; the first inner semiconductor layer is provided between the active layer and the n-type cladding layer; the second inner semiconductor layer is provided between the active layer and the p-type cladding layer; the active layer and the first inner semiconductor layer of the first group III nitride semiconductor region constitute a first heterojunction, the n-type cladding layer is formed of a group III nitride semiconductor; the first heterojunction is inclined at an angle of inclination, which is greater than zero, with respect to a reference plane that extends along a c-plane of the group III nitride semiconductor of the n-type cladding layer; the active layer includes a well layer which is formed of a gallium nitride semiconductor and which contains a compressive strain, and a piezoelectric polarization of the well layer is oriented in a direction from the p-type cladding layer toward the n-type cladding layer; the active layer and the second inner semiconductor layer of the second group III nitride semiconductor region constitute a second heterojunction; the second group III nitride semiconductor region includes a semiconductor ridge; the semiconductor ridge includes a third heterojunction between the second inner semiconductor layer and the p-type cladding layer; the second inner semiconductor layer includes a first portion which is located within 80 nm from the second heterojunction as defined in the direction of the stacking axis and which forms the second heterojunction with the active layer, a second portion defined as a region from the third heterojunction to a bottom of the semiconductor ridge, and a third portion between the first portion and the second portion; the first portion, the third portion, and the second portion are arranged in this order along the stacking axis; and the third portion of the second inner semiconductor layer includes a region in which the composition of material of the second inner semiconductor layer monotonically varies in a direction from the n-type cladding layer toward the p-type cladding layer.

According to the above-described nitride semiconductor light emitting device, the active layer forms a heterojunction (a first heterojunction) with the first inner semiconductor layer of the first group III nitride semiconductor region, and the heterojunction is inclined at an angle of inclination, which is greater than zero, with respect to a reference plane extending along a c-plane of the group III nitride semiconductor of the n-type cladding layer. Therefore, the active layer is provided on a so-called semipolar plane. When the active layer includes a well layer containing a compressive strain, in a semiconductor ridge fabricated on a semipolar plane in which a piezoelectric polarization of the well layer is oriented in a direction from a p-type cladding layer toward an n-type cladding layer, a lateral spread of carriers originating from the semiconductor ridge is greater compared to a lateral spread of carriers originating from a semiconductor ridge provided on a c-plane.

According to a present inventors' analysis of a structure in which the active layer forms a heterojunction (a second heterojunction) with the second inner semiconductor layer, the semiconductor ridge in the second group III nitride semiconductor region includes a heterojunction (a third heterojunction) between the second inner semiconductor layer and the p-type cladding layer, whereas the third portion of the second inner semiconductor layer, in other words, a semiconductor portion between the bottom of the semiconductor ridge and a position of 80 nm away from the second heterojunction as defined in the direction of the stacking axis to includes a compositional gradient but not a heterojunction. When this semiconductor portion does not include any heterojunction, a horizontal spread of carriers resulting from a dip in the hole band does not occur, thereby reducing an increase in threshold current.

In the above-described nitride semiconductor light emitting device according to the aspects of the present invention, a band gap of the p-type cladding layer may be larger than a band gap of the second portion of the second inner semiconductor layer at the third heterojunction, and the angle of inclination may be within the range of 50 degrees or more and 80 degrees or less or the range of 130 degrees or more and 170 degrees or less.

According to the nitride semiconductor light emitting device described above, since the band gap of the p-type cladding layer is larger than the band gap of the second inner semiconductor layer at the third heterojunction tilted at an angle within the range of the above-described angle of inclination, a dip is formed in the band gap of the second inner semiconductor layer in a vicinity of the third heterojunction at an angle within the range of the above-described angle of inclination. A dip in the hole band causes a lateral spreading of holes. However, since the third heterojunction is located in the semiconductor ridge, the spread of carriers at the third heterojunction is restricted within the range of the width of the semiconductor ridge in the lateral direction.

In the above-described nitride semiconductor light emitting device according to the aspects of the present invention, the first portion of the second inner semiconductor layer is within 80 nm from the second heterojunction as defined in a direction of the stacking axis, and the third portion of the second inner semiconductor layer does not include any heterojunction.

In the above-described nitride semiconductor light emitting device, according to an analysis conducted by the present inventors, when a group III nitride semiconductor (small band gap) and a group III nitride semiconductor (large band gap) are arranged so as to form a heterojunction, the hole band of the second inner semiconductor layer has a dip at the heterojunction. This dip in the hole band causes a lateral spreading of holes. The third portion of the second inner semiconductor layer including no heterojunction, however, prevents the lateral spreading of carriers due to the dip in the hole band from occurring.

In addition, according to an analysis by the present inventors, in a portion within 80 nm from the second heterojunction as defined in the direction of the stacking axis is less affected by the carrier spread caused by a heterojunction in which the dip in the hole band is formed.

In the above-described nitride semiconductor light emitting device according to the aspects of the present invention, the second inner semiconductor layer may include a first optical guiding layer and a second optical guiding layer, material of the first optical guiding layer may be different from a material of the second optical guiding layer, and the second portion of the second inner semiconductor layer may include a junction constituted by the first optical guiding layer and the second optical guiding layer.

According to the above-described nitride semiconductor light emitting device, since the first optical guiding layer and the second optical guiding layer composed of materials that differ from each other form a refractive index profile in the second inner semiconductor layer to enable optical confinement in a favorable manner. On the other hand, the second portion of the second inner semiconductor layer includes a heterojunction constituted by the first optical guiding layer and the second optical guiding layer. This heterojunction forms a dip in the hole band. The heterojunction is, however, included in the semiconductor ridge, thereby avoiding an occurrence of the lateral spreading of carriers due to the dip in the hole band.

In the above-described nitride semiconductor light emitting device according to the aspects of the present invention, the third portion of the second inner semiconductor layer may include a compositionally-graded region in which the composition of material of the second inner semiconductor layer monotonically varies in a direction from the n-type cladding layer toward the p-type cladding layer.

According to the above-described nitride semiconductor light emitting device, the compositionally-graded region is capable of providing the second inner semiconductor layer with a refractive index profile and does not generate any dip in the hole band.

In the above-described nitride semiconductor light emitting device according to the aspects of the present invention, the second portion and the third portion of the second inner semiconductor layer may include a first optical guiding layer and a second optical guiding layer, a band gap of the second optical guiding layer may be greater than a band gap of the first optical guiding layer, the second portion and the third portion of the second inner semiconductor layer may further include a compositionally-graded region in which the composition of materials of the second inner semiconductor layer monotonically varies in a direction from the n-type cladding layer toward the p-type cladding layer, the first optical guiding layer may have a composition that is substantially constant, and the second optical guiding layer may have a composition that is substantially constant.

According to the above-described nitride semiconductor light emitting device, the compositionally-graded region connects the first optical guiding layer and the second optical guiding layer with each other to form a refractive index profile in the second inner semiconductor layer. On the other hand, due to the compositionally-graded region, the first optical guiding layer and the second optical guiding layer form no heterojunction. Accordingly, while the second inner semiconductor layer includes the first optical guiding layer and the second optical guiding layer that has refractive indexes that differ from each other, no dip is formed in the hole band of the second inner semiconductor layer.

In the above-described nitride semiconductor light emitting device according to the aspects of the present invention, the first portion of the second inner semiconductor layer may include an electron blocking layer.

According to the above-described nitride semiconductor light emitting device, the first region of the second inner semiconductor layer includes an electron blocking layer, and accordingly the first region includes a heterojunction. This heterojunction forms a dip in a hole band of the first region. However, an effect of the heterojunction pertaining to the electron blocking layer on the spread of carriers is not significant because the first region of the second inner semiconductor layer is close enough to the active layer so as to form a junction in the active layer.

In the above-described nitride semiconductor light emitting device according to the aspects of the present invention, the first portion may include an optical guiding layer provided between the electron blocking layer and the active layer, and a fourth heterojunction between the optical guiding layer and the electron blocking layer, and the fourth heterojunction may be separated from the second heterojunction by a distance of 10 nm or more as defined in a direction of the stacking axis.

According to the above-described nitride semiconductor light emitting device, a dopant may possibly be added to a semiconductor layer pertaining to the fourth heterojunction. The distance of 10 nm or more prevents dopant diffusion from affecting the active layer.

The above-described nitride semiconductor light emitting device according to the aspects of the present invention may further comprise a substrate having a semipolar primary surface which comprises a group III nitride semiconductor. An angle formed by the semipolar primary surface and the reference plane is within a range of 50 degrees or more and 80 degrees or less or 130 degrees or more and 170 degrees or less, and the first group III nitride semiconductor region, the active layer, and the second group III nitride semiconductor region are provided on the semipolar primary surface.

According to the above-described nitride semiconductor light emitting device, when a group III nitride semiconductor layer that is epitaxially grown on the substrate is used to form a heterojunction, a dip is formed in a hole band in association with the heterojunction.

In the above-described nitride semiconductor light emitting device according to the aspects of the present invention, the substrate may be made of GaN. According to this nitride semiconductor light emitting device, a compressive strain is contained in an InGaN layer that is coherently and epitaxially grown on the GaN substrate.

In the above-described nitride semiconductor light emitting device according to the aspects of the present invention, a thickness of the first inner semiconductor layer may be 200 nm or more and 500 nm or less, the first inner semiconductor layer may include a first optical guiding region provided between the n-type cladding layer and the active layer, a thickness of the second inner semiconductor layer may be 200 nm or more and 500 nm or less, and the second inner semiconductor layer may include a second optical guiding region provided between the p-type cladding layer and the active layer.

According to the above-described nitride semiconductor light emitting device, in a long wavelength emission laser such as a green laser, a refractive index difference between an optical guiding layer and a cladding layer cannot be increased because of a wavelength dispersion in refractive index. A thick optical guiding layer can be effectively used in order to increase optical confinement capability. However, when a total film thickness of an optical guiding layer exceeds 500 nm, a series resistance of the second inner semiconductor layer in a semiconductor region from the active layer to an anode electrode becomes too large to ignore and may cause increase in drive voltage. In addition, a total film thickness of an optical guiding layer exceeding 500 nm in the first inner semiconductor layer may increase strain of the optical guiding layer and may deteriorate the crystallinity.

In the above-described nitride semiconductor light emitting device according to the aspects of the present invention, the second inner semiconductor layer may include the second optical guiding region, the second optical guiding region may include an undoped $In_XGa_{1-X}N$ layer (0<X<1) and a Mg-doped $In_XGa_{1-X}N$ layer (0<X<1), the undoped $In_XGa_{1-X}N$ layer may be provided between the active layer and the Mg-doped $In_XGa_{1-X}N$ layer, a total film thickness of the undoped $In_XGa_{1-X}N$ layer and the Mg-doped $In_XGa_{1-X}N$ layer may be greater than a distance between the second heterojunction and the bottom of the semiconductor ridge, and a junction between the undoped $In_XGa_{1-X}N$ layer and the Mg-doped $In_XGa_{1-X}N$ layer may be located between the second heterojunction and the bottom of the semiconductor ridge.

According to the above-described nitride semiconductor light emitting device, the undoped $In_XGa_{1-X}N$ layer and the Mg-doped $In_XGa_{1-X}N$ layer have the same In composition, and hence the layers do not constitute a hetero interface and the lateral spread of carriers due to a dip of the hole band can be avoided. In consideration of reduction in absorption loss, the $In_XGa_{1-X}N$ layer near the active layer is favorably undoped. In addition, the undoped $In_XGa_{1-X}N$ layer which is provided between the active layer and the Mg-doped $In_XGa_{1-X}N$ layer can prevent the diffusion of Mg from the optical guiding layer to the active layer.

In the above-described nitride semiconductor light emitting device according to the aspects of the present invention, the second inner semiconductor layer may include the second optical guiding region, the second optical guiding region may include an undoped $In_{X1}Ga_{1-X1}N$ layer (0<X1<1), a Mg-doped $In_{X1}Ga_{1-X1}N$ layer (0<X1<1), and a Mg-doped $In_{X2}Ga_{1-X2}N$ layer (0≤X2<X1<1), the undoped $In_{X1}Ga_{1-X1}N$ layer, the Mg-doped $In_{X1}Ga_{1-X1}N$ layer, and the Mg-doped $In_{X2}Ga_{1-X2}N$ layer may be arranged in this order in a direction from the n-type cladding layer toward the p-type cladding layer, the Mg-doped $In_{X2}Ga_{1-X2}N$ layer may form a junction with the Mg-doped $In_{X1}Ga_{1-X1}N$ layer, and a total thickness of the undoped $In_{X1}Ga_{1-X1}N$ layer and the Mg-doped $In_{X1}Ga_{1-X1}N$ layer may be greater than a distance between the second heterojunction and the bottom of the semiconductor ridge.

According to the above-described nitride semiconductor light emitting device, since the total thickness of the undoped $In_{X1}Ga_{1-X1}N$ layer and the Mg-doped $In_{X1}Ga_{1-X1}N$ layer is greater than a distance between the second heterojunction and the bottom of the semiconductor ridge, the junction that is between the Mg-doped $In_{X2}Ga_{1-X2}N$ layer and the Mg-doped $In_{X1}Ga_{1-X1}N$ layer is located in the semiconductor ridge. The above junction forms a dip in the hole band, but a lateral spread of carriers caused thereby can be avoided. Since an optical guiding region can be constituted by a semiconductor layer with a high In composition and a semiconductor with a low In composition (including zero), these layers achieve favorable crystalline quality without significant reduction in an optical confinement performance of the optical guiding region, and prevent the deterioration of crystalline quality of a cladding layer and a contact layer which are grown on the optical guiding region.

In the above-described nitride semiconductor light emitting device according to the aspects of the present invention, the second inner semiconductor layer may include the second optical guiding region, the second optical guiding region may include an undoped $In_{X1}Ga_{1-X1}N$ layer (0<X1<1), a Mg-doped $In_{X1}Ga_{1-X1}N$ layer (0<X1<1), a Mg-doped compositionally-graded $In_XGa_{1-X}N$ layer and a Mg-doped $In_{X2}Ga_{1-X2}N$ layer (0≤X2<X1<1), the undoped $In_{X1}Ga_{1-X1}N$ layer, the Mg-doped $In_{X1}Ga_{1-X1}N$ layer, the Mg-doped compositionally-graded $In_XGa_{1-X}N$ layer, and the Mg-doped $In_{X2}Ga_{1-X2}N$ layer may be arranged in this order in a direction from the n-type cladding layer toward the p-type cladding layer, the In composition X of the Mg-doped compositionally-graded $In_XGa_{1-X}N$ layer may be a composition X1 at an interface between the Mg-doped $In_{X1}Ga_{1-X1}N$ layer and the Mg-doped compositionally-graded InGaN layer and may be a composition X2 at an interface between the Mg-doped compositionally-graded InGaN layer and the Mg-doped $In_{X2}Ga_{1-X2}N$ layer, and may monotonically vary from the composition X1 to the composition X2, and the Mg-doped compositionally-graded $In_XGa_{1-X}N$ layer may be located between the second heterojunction and the bottom of the semiconductor ridge.

According to the above-described nitride semiconductor light emitting device, an In composition X in the Mg-doped compositionally-graded $In_XGa_{1-X}N$ layer monotonically varies from a composition X1 to a composition X2, and the Mg-doped compositionally-graded $In_XGa_{1-X}N$ layer is located between the second heterojunction and the semiconductor ridge, thereby providing a favorable optical guiding function and preventing the carriers from spreading in the lateral direction due to the dip of the hole band.

In the above-described nitride semiconductor light emitting device according to the aspects of the present invention, the angle of inclination may be within a range of 63 degrees or more and 80 degrees or less.

According to the above-described nitride semiconductor light emitting device, a semipolar plane having the above-described angle of inclination enables uniform In incorporation and growth of a gallium nitride semiconductor with a high In composition. These features become more apparent when the inclination coincides with the m-axis direction. In addition, the angle formed between the reference plane and the semipolar primary surface of the substrate may be within a range of 63 degrees or more and 80 degrees or less.

In the above-described nitride semiconductor light emitting device according to the aspects of the present invention, the active layer may be provided so as to generate an emission of a lasing spectrum having the peak wavelength within the range of 500 nm or more and 550 nm or less.

According to the above-described nitride semiconductor light emitting device, the active layer which emits an emission of a lasing spectrum having the peak wavelength in the range of 500 nm or more and 550 nm or less is fabricated using the semipolar plane. The carrier spreading caused by a heterojunction can be avoided in the nitride semiconductor light emitting device to which the above active layer is applied.

In the above-described nitride semiconductor light emitting device according to the aspects of the present invention, the well layer may form a junction with the second inner semiconductor layer in the active layer.

The above-described object and other objects, features, and advantages of the present invention will be apparent from the detailed description of the embodiments of the present invention with reference to the accompanying drawings.

BRIEF DESCRIPTION OF THE DRAWINGS

FIG. 4 is a view showing band diagrams of a {20-21} plane and a c-plane;

EMBODIMENTS

The teachings of the present invention will be readily understood in consideration of the following detailed description with reference to the accompanying drawings. Embodiments of a nitride semiconductor light emitting device and a method of fabricating the nitride semiconductor light emitting device according to the present invention will now be described with reference to the accompanying drawings. The same elements will be designated by the same references, if appropriate.

Figure 1:
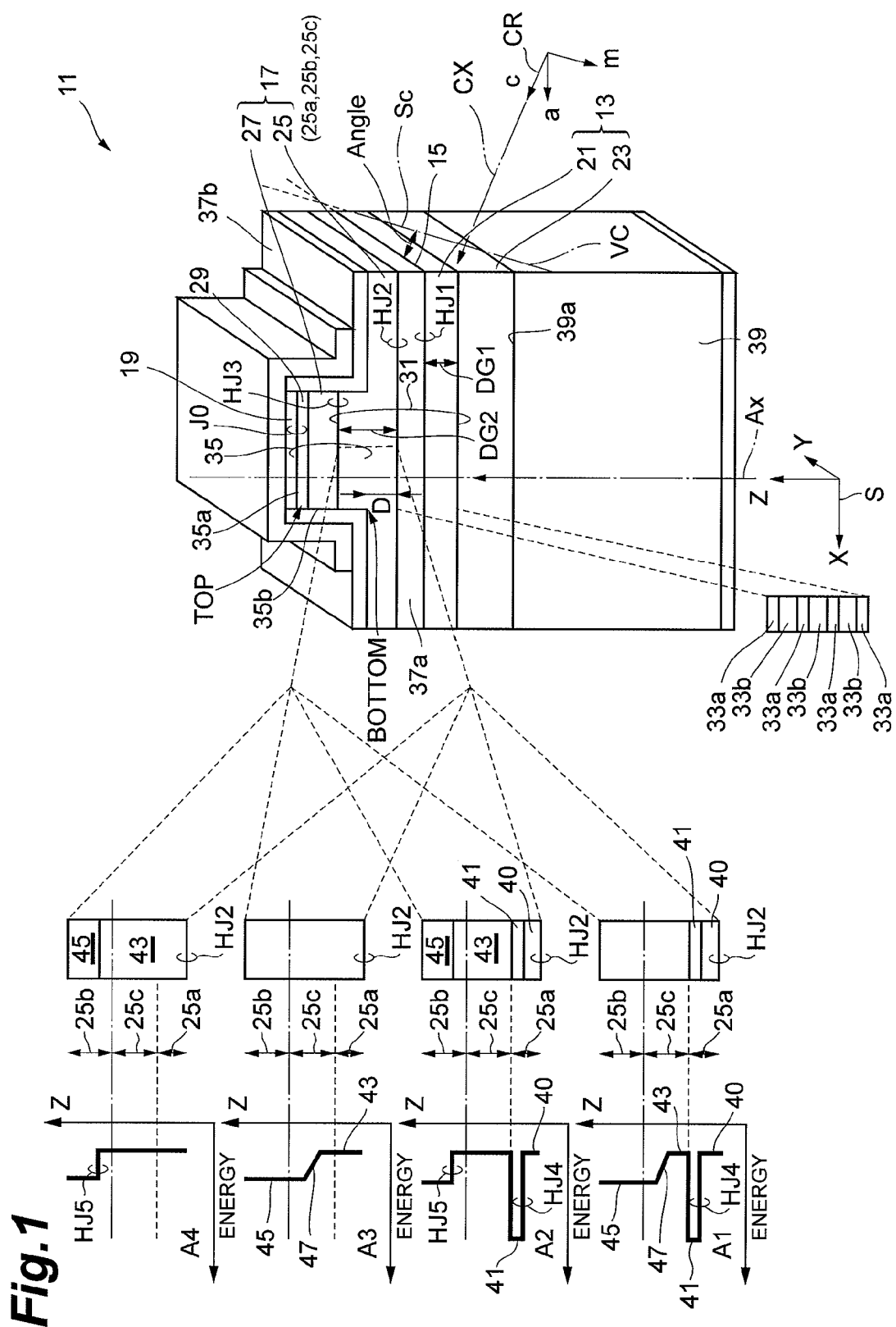
FIG. 1 is a view showing a structure pertaining to a nitride semiconductor light emitting device according to the present embodiment.

FIG. 1 is a diagram showing a structure pertaining to a nitride semiconductor light emitting device according to the present embodiment. FIG. 1 describes an XYZ coordinate system S and a crystal coordinate system CR. The crystal coordinate system CR has a c-axis, an a-axis, and an m-axis.

A nitride semiconductor light emitting device 11 includes a first group III nitride semiconductor region 13, an active layer 15, a second group III nitride semiconductor region 17, and an electrode 19. The first group III nitride semiconductor region 13 includes a first inner semiconductor layer 21 and an n-type cladding layer 23. The active layer 15 is provided on the first inner semiconductor layer 21. The first inner semiconductor layer 21 is provided on the n-type cladding layer 23. The second group III nitride semiconductor region 17 includes a second inner semiconductor layer 25 and a p-type cladding layer 27, whereby the p-type cladding layer 27 is provided on the second inner semiconductor layer 25. The second group III nitride semiconductor region 17 is provided on the active layer 15. The first inner semiconductor layer 21 is provided between the active layer 15 and the n-type cladding layer 23. The second inner semiconductor layer 25 is provided between the active layer 15 and the p-type cladding layer 27. The electrode 19 is provided on the second group III nitride semiconductor region 17. The first group III nitride semiconductor region 13, the active layer 15, and the second group III nitride semiconductor region 17 are arranged in this order along a stacking axis Ax (the direction of a Z axis of the coordinate system S).

The first inner semiconductor layer 21, the active layer 15, and the second inner semiconductor layer 23 constitute a core region 31, and the core region 31 is provided between the n-type cladding layer 23 and the p-type cladding layer 27. The n-type cladding layer 23, the core region 31, and the p-type cladding layer 27 form an optical waveguide structure.

The active layer 15 and the first inner semiconductor layer 21 constitute a first heterojunction HJ1. The n-type cladding layer 23 comprises a group III nitride semiconductor, and the first heterojunction HJ1 is inclined at an angle of inclination "Angle" of greater than zero with respect to the reference plane Sc that extends along a c-plane of the group III nitride semiconductor of the n-type cladding layer 23. In FIG. 1, the reference plane in the n-type cladding layer 23 is perpendicular to an axis indicating a direction of the c axis of the crystal coordinate system CR (an axis depicted by a vector VC). The active layer 15 includes at least one well layer 33a, and the well layer 33a comprises, for example, a gallium nitride semiconductor. The well layer 33a contains a compressive strain. The piezoelectric polarization of the well layer 33a has a component oriented in a direction from the p-type cladding layer 27 toward the n-type cladding layer 23. A direction of the piezoelectric polarization on the semipolar plane is opposite to a direction of a piezoelectric polarization on the c-plane. The well layer 33a may include, for example, an InGaN layer.

When necessary, the active layer 15 may include plural well layers 33a and at least one barrier layer 33b. The barrier layer 33b is provided between adjacent well layers 33a. An outermost layer of the active layer 15 may be composed of a well layer. The well layer 33a of the active layer 15 and the second inner semiconductor layer 25 constitute a second heterojunction HJ2.

The second group III nitride semiconductor region 17 includes a semiconductor ridge 35. In the present embodiment, the semiconductor ridge 35 extends along a plane defined by the c-axis and the m-axis of the group III nitride semiconductor of the n-type cladding layer 23. The nitride semiconductor light emitting device 11 includes side end faces 37a and 37b. In one example, the end faces 37a and 37b may constitute an optical cavity. The semiconductor ridge 35 includes a third heterojunction HJ3 that the second inner semiconductor layer 25 and the p-type cladding layer 27 form. The third heterojunction HJ3 terminates at the face 35b of the semiconductor ridge 35. The semiconductor ridge 35 includes a top "TOP" and a bottom "BOTTOM." An upper surface 35a of the semiconductor ridge 35 forms a junction J0 with the electrode 19. The distance D between the bottom BOTTOM of the semiconductor ridge 35 and the second heterojunction HJ2 is 200 nm or less.

The second inner semiconductor layer 25 includes a first portion 25a, a second portion 25b and a third portion 25c. The first portion 25a, the third portion 25c and the second portion 25b are arranged in this order along the stacking axis Ax. The first portion 25a forms a second heterojunction HJ2 with the well layer 33a of the active layer 15. The second portion 25b is a region from the third heterojunction HJ3 to the bottom BOTTOM of the semiconductor ridge 35. The third portion 25c is located between the first portion 25a and the second portion 25b.

The semiconductor ridge 35 includes a portion of the second inner semiconductor layer 25, the p-type cladding layer 27, and a p-type contact layer 29. The second inner semiconductor layer 25 acts as an optical guiding layer, the p-type cladding layer 27 is provided on the optical guiding layer and the p-type contact layer 29 is provided on the p-type cladding layer 27.

In the nitride semiconductor light emitting device 11, the active layer 15 forms a heterojunction (the first heterojunction HJ1) with the first inner semiconductor layer 21 of the first group III nitride semiconductor region 13. The heterojunction HJ1 is inclined at an angle of inclination "Angle," which is greater than zero, with respect to the reference plane "Sc" that extends along the c-plane of the group III nitride semiconductor of the n-type cladding layer 23 and, consequently, the active layer 15 is provided on a so-called semipolar plane. When the active layer 15 includes the well layer 33a incorporating a compressive strain,
in the semiconductor ridge 35 fabricated on a semipolar plane in which a piezoelectric polarization of the well layer 33a is oriented in a direction from the p-type cladding layer toward the n-type cladding layer, a lateral spread of carriers flowing from the semiconductor ridge 35 is greater compared to a lateral spreading of carriers flowing from a semiconductor ridge provided on the c-plane. When the distance between the bottom "BOTTOM" of the semiconductor ridge 35 and the second heterojunction "HJ2" is not more than 200 nm, an increase in an amount of carriers, which flow from the semiconductor ridge 35, spreading in the lateral direction is reduced, so that waveguide loss resulting from a mismatch between a light distribution and a carrier distribution in the optical waveguide structure can be reduced. As a result, an increase in threshold current is reduced.

Example 1

In a ridge-type nitride semiconductor laser fabricated on a c-plane, since a p-type nitride semiconductor region has a high resistance, the confinement of current into a width of a semiconductor ridge structure is achieved at a desired level. This results in that, in a ridge-type nitride semiconductor laser fabricated on a c-plane, a degree of matching between a carrier distribution and a light distribution is acceptable.

On the other hand, when a ridge-type nitride semiconductor laser having a ridge depth at which desired current confinement is achieved in a ridge-type nitride semiconductor laser formed on the c-plane is fabricated using some of the semipolar plane orientations, the laser has an insufficient current confinement. The insufficient current confinement leads to an increase in threshold current. In this ridge-type nitride semiconductor laser, waveguide loss due to a mismatch between a carrier distribution and a guided light distribution leads to a deterioration of lasing characteristics. An analysis conducted by the present inventors has shown that, in a semipolar plane having a piezoelectric polarization in a direction which is opposite to that of a c-plane, the spreading of current in the lateral direction in the p-type nitride semiconductor region leads to a greater increase in threshold current as compared with a p-type nitride semiconductor region on the c-plane.

A semipolar GaN substrate is prepared. A primary surface of the semipolar GaN substrate has a {20-21} plane. On the {20-21} plane, a c-axis of GaN of the substrate is inclined at an angle of 75 degrees with respect to a direction of an m-axis of the GaN. Thermal cleaning of the GaN substrate is performed. The thermal cleaning is performed in an atmosphere including ammonia ($NH_3$) and hydrogen ($H_2$) at a heat treatment temperature of 1050 degrees Celsius. After such preprocessing, first, a first group III nitride semiconductor region is grown thereon. An n-type GaN layer is grown on a semipolar primary surface of the GaN substrate. The growth temperature is 1050 degrees Celsius. After lowering the substrate temperature to 840 degrees Celsius, an n-type cladding layer is grown on the n-type GaN layer. In the present example, an n-type InAlGaN cladding layer with a thickness of 2 μm is grown for forming the n-type cladding layer. The n-type InAlGaN cladding layer has an In composition of 0.03 and an Al composition of 0.14. At the substrate temperature of 840 degrees Celsius, an n-type GaN optical guiding layer and an n-type InGaN optical guiding layer are grown on the n-type InAlGaN cladding layer. The InGaN layer has an In composition of 0.03. After forming an n-side inner semiconductor layer including these optical guiding layers, an active layer is grown on the inner semiconductor layer. In the present example, as the active layer, an InGaN layer is grown at a substrate temperature of 790 degrees Celsius. The InGaN layer has an In composition of 0.30 and a thickness of 3 nm. A second group III nitride semiconductor region is grown on the active layer. For example, after raising the substrate temperature to 840 degrees Celsius, an undoped InGaN optical guiding layer is grown on the active layer and a p-type GaN optical guiding layer is grown thereon. The InGaN layer has an In composition of 0.03. After forming a p-side inner semiconductor layer including these optical guiding layers, a p-type InAlGaN cladding layer with a thickness of 400 nm is grown on the inner semiconductor layer. The p-type InAlGaN cladding layer has an In composition of 0.02 and an Al composition of 0.07. After raising the substrate temperature to 1000 degrees Celsius, a p-type GaN contact layer with a thickness of 50 nm is grown on the p-type InAlGaN cladding layer. Through these processes, an epitaxial substrate can be fabricated.

The epitaxial substrate is subjected to photolithography, dry etching and vacuum deposition to fabricate a ridge-type gallium nitride semiconductor laser, which includes a semiconductor ridge with a width of 2 μm and an optical cavity with a length of 600 μm.

The fabrication includes the step of etching the second group III nitride semiconductor region to form the semiconductor ridge. The process by use of dry etching is used to form the semiconductor ridge. Plural semiconductor lasers having different semiconductor ridge heights are fabricated by a number of dry etching process recipes allowing an amount of etching to be varied. In the processing of a semiconductor ridge, a distance from an interface between the active layer and the optical guiding layer to a bottom of the semiconductor ridge is referred to as a value "D".

The processing by dry etching forms an upper surface and a side surface of the semiconductor ridge. After forming the semiconductor ridge, an insulating film such as a silicon oxide film (more specifically, $SiO_2$) is formed thereon. The insulating film covers the side surface of the semiconductor ridge and a surface (a surface formed by etching) of the optical guiding layer, and has an opening on the upper surface (a semipolar contact surface) of the semiconductor ridge. An electrode is formed on the semiconductor ridge. An anode electrode (for example, Ni/Au) is formed by vapor deposition on the upper surface of the semiconductor ridge. A pad electrode (for example, Ti/Au) is formed so as to cover the ohmic electrode. A back surface of the GaN substrate is polished to form a polished substrate with a substrate thickness of 80 μm. A cathode electrode (for example, Ti/Al) and a pad electrode (for example, Ti/Au) are formed over an entire polished surface of the GaN substrate. Through these processes, a substrate product has been fabricated.

After forming the electrodes, the substrate product is separated to form end faces (end faces that are not cleavage planes) for an optical cavity. A dielectric multilayer is formed on the end faces. The dielectric multilayer is composed of $SiO_2/TiO_2$. After these processes, a semiconductor laser is formed on the {20-21} plane of a semipolar GaN substrate that is inclined at an angle of 75 degrees with respect to the direction of the m-axis. This semiconductor laser is capable of emitting light in a 520 nm wavelength band.

As a comparative example, the structure of the epitaxial substrate described above is fabricated on a c-plane GaN substrate. In an epitaxial substrate using a c-plane GaN substrate, a well layer includes an InGaN layer (In composition of 0.07), and the semiconductor laser thereof is capable of lasing in a 410 nm band. The end faces of this semiconductor laser are not coated.

Figure 2:
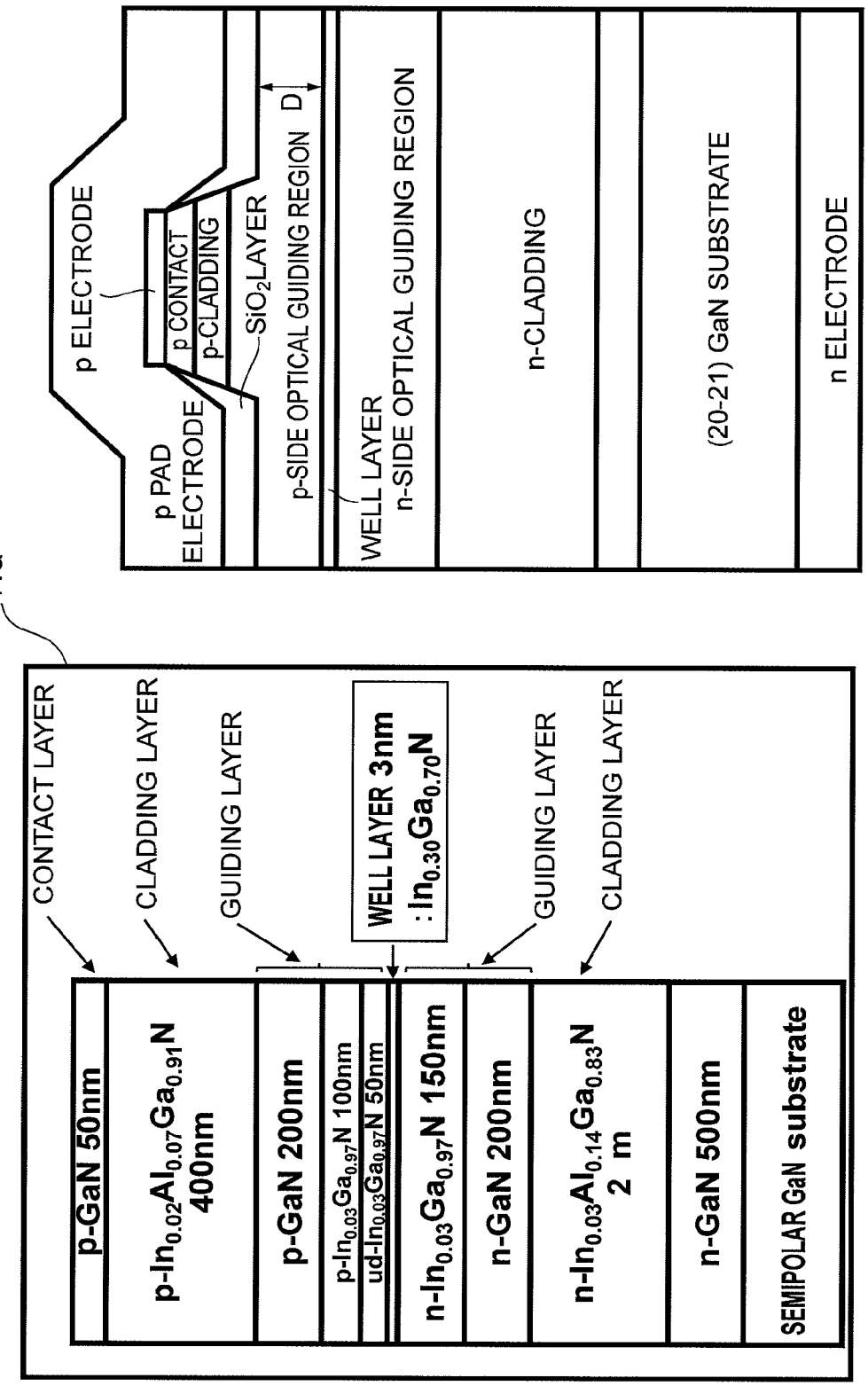
FIG. 2 is a schematic view showing a structure of a ridge-type nitride semiconductor laser according to a first example.
Figure 3:
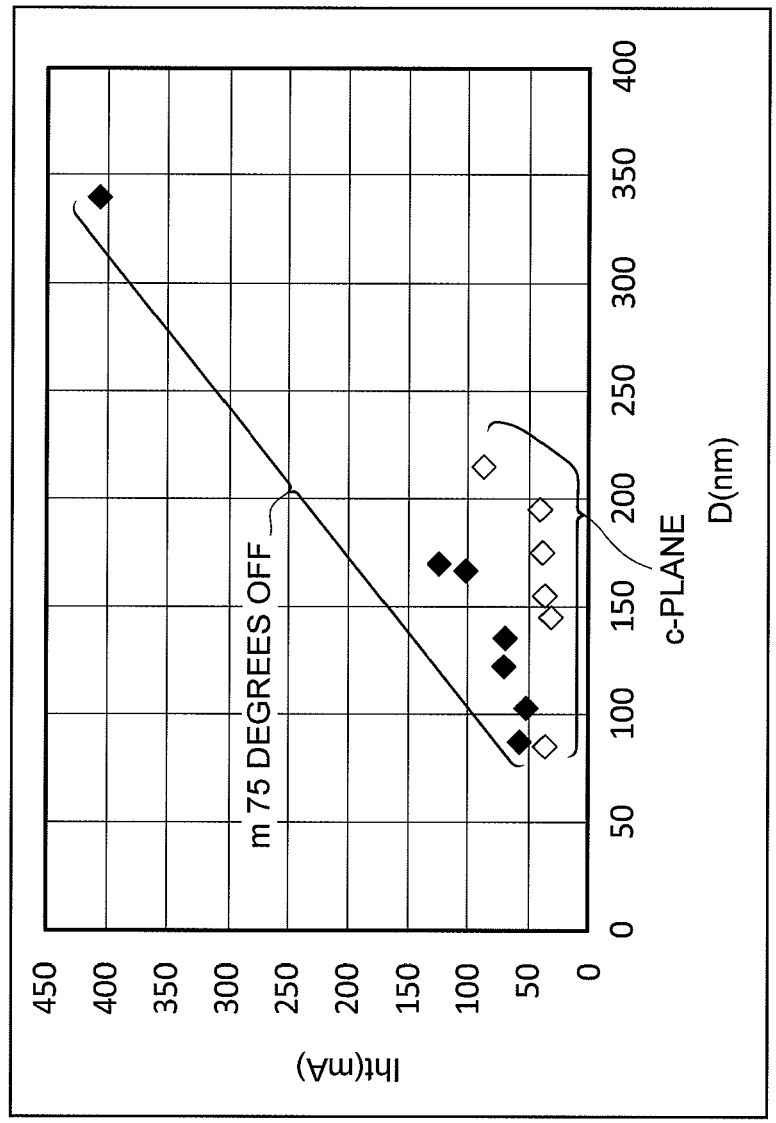
FIG. 3 is a view showing a relationship between a threshold current Ith and a distance D measured by supplying pulsed currents to both semiconductor lasers on a {20-21} plane and a c-plane.

FIG. 2 is a diagram schematically showing a structure of the ridge-type nitride semiconductor laser according to the first example. Part (a) of FIG. 2 is a diagram schematically showing a structure of an epitaxial substrate for the ridge-type nitride semiconductor laser according to the first example. Part (b) of FIG. 2 is a diagram schematically showing a ridge structure of the ridge-type nitride semiconductor laser according to the first example. FIG. 3 is a diagram showing a relationship between a threshold current Ith and a distance D measured by applying pulsed currents to both semiconductor lasers on a {20-21} plane and a c-plane. In a semiconductor laser 11a on the {20-21} plane, the threshold current Ith increases abruptly around the distance D of 150 nm or more.

On the other hand, with the semiconductor laser on the c-plane, the threshold current Ith increases abruptly when around the distance of 200 nm or more.

When the active layer includes a well layer that contains a compressive strain, the semiconductor laser on the {20-21} plane described above includes the well layer having a piezoelectric polarization that is oriented in a direction from the p-type cladding layer toward the n-type cladding layer. A semiconductor ridge structure is fabricated on the semipolar surface of the above active layer. Observations by the present inventors has found, as shown in FIG. 3, that this structure causes a horizontal spread of carriers from the semiconductor ridge that is greater than a horizontal spread of carriers originating from a semiconductor ridge provided on a c-plane. In the semiconductor laser on the {20-21} plane, when the distance D between the bottom of the semiconductor ridge and the second heterojunction is 200 nm or less, it is conceivable that the horizontal spread of carriers originating from the semiconductor ridge is acceptable and waveguide loss arising from a difference between a light distribution and a carrier distribution in the optical waveguide structure would be acceptable, thereby suppressing an increase in threshold current.

According to further observations by the present inventors, the distance D of 150 nm described above is approximately equal to a total film thickness of the undoped InGaN optical guiding layer and the p-type InGaN optical guiding layer in the p-side inner semiconductor layer. The undoped InGaN optical guiding layer and the p-type InGaN optical guiding layer of the p-side inner semiconductor layer form a heterojunction. As shown in Part (a) of FIG. 4, two-dimensional hole gas is created at the heterojunction in a hole band in the semiconductor laser on the {20-21} plane. When the heterojunction that generates two-dimensional hole gas HG is located outside the semiconductor ridge, it is likely that the two-dimensional hole gas HG causes carriers in the lateral direction to spread in the p-side semiconductor region. On the other hand, as shown in Part (b) of FIG. 4, two-dimensional hole gas cannot be generated at the heterojunction in the hole band in the semiconductor laser on the c-plane.

As shown in FIG. 4, since the band bending of a well layer WS on the {20-21} plane is in an opposite direction to the band bending of the well layer WC on the c-plane, the direction of a piezoelectric polarization in the well layer WS on the {20-21} plane is opposite to the direction of a piezoelectric polarization in the well layer WC on the c-plane. In the semiconductor laser on the c-plane, a phenomenon such as the generation of two-dimensional hole gas does not occur as is the case of the semiconductor laser on the {20-21} plane.

In FIG. 4, a dashed line RG indicates a position of the bottom BOTTOM of the semiconductor ridge. When the semiconductor ridge does not include the heterojunction HJ, carriers from the semiconductor ridge also flow horizontally by the action of the two-dimensional hole gas.

Example 2

Figure 5:
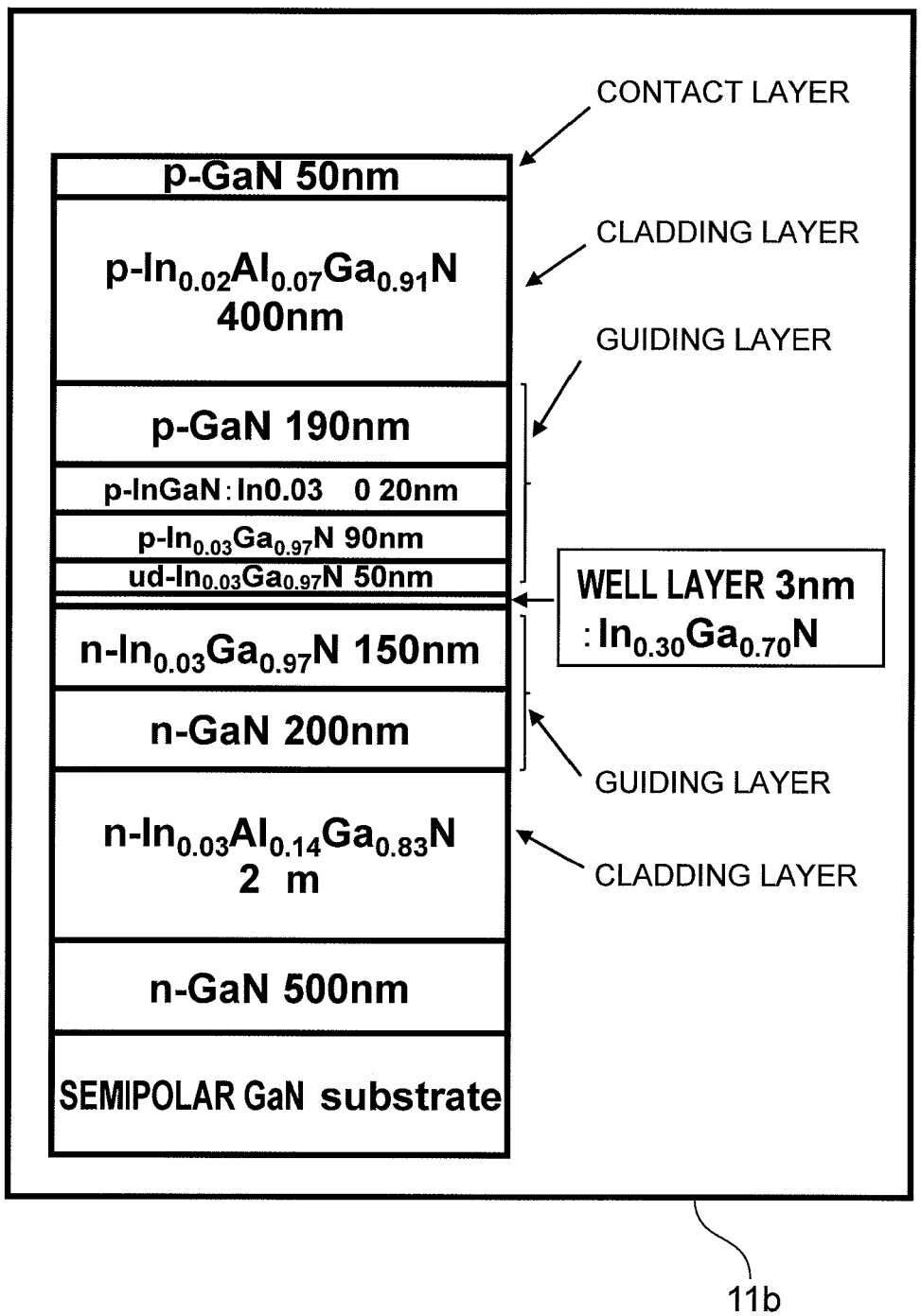
FIG. 5 is a schematic view showing a structure of a ridge-type nitride semiconductor laser according to a second example.

FIG. 5 is a diagram schematically showing a structure of a ridge-type nitride semiconductor laser according to a second example. In a nitride semiconductor laser 11b of a ridge-type according to the second example, a compositionally-graded layer with a thickness of 20 nm is provided between the p-type InGaN optical guiding layer and the p-type GaN optical guiding layer in the p-side inner semiconductor layer of the laser structure on the semipolar plane according to the first example. In the compositionally-graded layer, an In composition increases continuously from an In composition value at an interface of the p-type InGaN optical guiding layer to an In composition value (an In composition of zero) of the p-type GaN optical guiding layer. In the step of etching for forming a semiconductor ridge, the distance D is set to 170 nm.

A threshold current Ith of the semiconductor laser is around 70 mA and, referring to FIG. 3, is about 60 to 70% lower than a threshold of a semiconductor laser having a distance D of 170 nm according to a comparison. The reduction in threshold current conceivably indicates that a heterojunction in an optical guiding region is replaced by a compositionally-graded layer and that this layer can suppress the carrier spreading caused by the two-dimensional hole gas.

An evaluation of the results of the first and second examples described above suggests that the nitride semiconductor light emitting device 11 according to the present embodiment is favorably configured to as follows.

Referring to FIG. 1 again, the nitride semiconductor light emitting device 11 according to the present embodiment will be described. The angle of inclination "Angle" may be set to within a range of 50 degrees or more and 80 degrees or less or 130 degrees or more and 170 degrees or less. A band gap of the p-type cladding layer 27 is greater than a band gap of the second portion 25b of the second inner semiconductor layer 25 at the third heterojunction HJ3. Accordingly, a dip is formed in the hole band of the second inner semiconductor layer 25 in a vicinity of the third heterojunction HJ3. This dip in the hole band causes spreading of holes in the lateral direction. The third heterojunction HJ3 is, however, located inside the semiconductor ridge 35, and hence the lateral spreading of carriers in the third heterojunction HJ3 is restricted within a range of the width of the semiconductor ridge 35.

The nitride semiconductor light emitting device 11 may further comprise a substrate 39. The substrate 39 has a semipolar primary surface 39a composed of a group III nitride semiconductor. The semipolar primary surface 39a is tilted with respect to the reference plane Sc which is perpendicular to an axis (the axis Cx depicted by the vector VC) extending in a direction of the c-axis of the group III nitride semiconductor, and an angle (which is substantially equal to the angle "Angle") formed by the semipolar primary surface 39a and the reference plane Sc may be set to within a range of 50 degrees or more and 80 degrees or less or 130 degrees or more and 170 degrees or less. The first group III nitride semiconductor region 13, the active layer 15 and the second group III nitride semiconductor region 17 are provided on the semipolar primary surface 39a. When a group III nitride semiconductor layer epitaxially grown on the substrate 39 as described above forms a heterojunction, the heterojunction form a dip in the hole band. The substrate 39 may be made of GaN. an InGaN layer coherently and epitaxially grown on the GaN substrate incorporates a compressive strain.

In addition, the angle of inclination "Angle" may be set to a range of 63 degrees or more and 80 degrees or less. The semipolar plane 39a having the above angle of inclination "Angle" enables uniform In incorporation and growth of a gallium nitride semiconductor with a high In composition. Furthermore, the angle formed between the reference plane Sc and the semipolar primary surface 39a of the substrate 39 may be set to within a range of 63 degrees or more and 80 degrees or less.

The active layer 15 may be provided so as to generate an emission of a spectrum having a peak wavelength in a range of 500 nm or more and 550 nm or less. A semipolar plane allows the fabrication of the active layer 15 that generates an emission of the spectrum having a peak wavelength in a range of not less than 500 nm and not more than 550 nm. When applying the active layer 15 to the nitride semiconductor light emitting device 11, flowing of carriers in the lateral direction due to a heterojunction can be avoided. In the active layer 15, the well layer 33a may form a junction with the second inner semiconductor layer 27.

Referring now to FIG. 1, structures A1, A2, A3, and A4 of the second inner semiconductor 25 are shown.

Structures A1 to A4.

In the nitride semiconductor light emitting device 11, an analysis by the present inventors has found that, when a group III nitride semiconductor (small band gap) and a group III nitride semiconductor (large band gap) are arranged so as to form a heterojunction, a dip is formed in the hole band of the second inner semiconductor layer 25 at the heterojunction. When the heterojunction is not included in the semiconductor ridge 35, the dip in the hole band causes a lateral spreading of holes. The third portion 25c does, however, include no heterojunction as is the case of the structures A1 to A4 shown in FIG. 1 and hence can avoid the occurrence of a lateral spreading of carriers caused by the dip in the hole band.

Structures A1 and A2.

An analysis by the present inventors has found that, a portion within 80 nm from the second heterojunction HJ2 as defined in the direction of the stacking axis Ax is less affected by the lateral flowing of carriers at a heterojunction which forms a dip in a hole band. In the structures A1 and A2 shown in FIG. 1, the first portion 25a of the second inner semiconductor layer 25 is provided by a thickness of a thin semiconductor layer 40 and may include an electron blocking layer 41. When the electron blocking layer 41 is contained by the first portion 25a that is within 80 nm from the second heterojunction HJ2 in the second inner semiconductor layer 25, the first portion 25a includes a heterojunction HJ4. The heterojunction HJ4 forms a dip in a hole band of the first region 25a. The first region 25a is located close enough to the active layer 15 so as to form a junction with the active layer 15, and hence the heterojunction HJ4 pertaining to the electron blocking layer 41 has little influence on the carrier spread.

In addition, the fourth heterojunction HJ4 of the first portion 25a is favorably apart from the second heterojunction HJ2 by a distance of 10 nm or more as defined in the direction of the stacking axis Ax. A dopant may possibly be added to a semiconductor layer pertaining to the fourth heterojunction HJ4 (for example, the electron blocking layer 41). The above distance of 10 nm or more can prevent dopant diffusion from affecting the active layer 15. A thin semiconductor layer is provided between the active layer 15 and the electron blocking layer 41 in order to provide the above-described distance of 10 nm or more. The thin semiconductor layer may comprise the same material as an optical guiding layer or a barrier layer. The thin semiconductor layer may comprise a gallium nitride semiconductor such as GaN or InGaN, which has a band gap between a band gap of the electron blocking layer 41 and a band gap of a well layer.

Structures A3 and A4.

On the other hand, as in the first and second examples, in the nitride semiconductor light emitting device 11, the first portion 25a of the second inner semiconductor layer 25 is within 80 nm from the second heterojunction HJ2 as defined in the direction of the stacking axis Ax, and the third portion 25c includes no heterojunction.

Structures A2 and A4.

The second inner semiconductor layer 25 may include a first optical guiding layer 43 and a second optical guiding layer 45. Material of the first optical guiding layer 43 is different from a material of the second optical guiding layer 35. A band gap of the second optical guiding layer 45 is, therefore, greater than a band gap of the first optical guiding layer 43. The second portion 25b includes a junction HJ5 comprising the first optical guiding layer 43 and the second optical guiding layer 45. The first optical guiding layer 43 and the second optical guiding layer 45 are respectively composed of materials that differ from each other, and hence can form a refractive index profile in the second inner semiconductor layer 25. On the other hand, the second portion 25b of the second inner semiconductor layer 25 includes a heterojunction HJ5 comprising the first optical guiding layer 43 and the second optical guiding layer 45. The heterojunction HJ5 forms a dip in the hole band. The heterojunction HJ5 is, however, included in the semiconductor ridge 35, and this structure can avoid the occurrence of a horizontal carrier spreading due to the dip in the hole band.

Structures A1 and A3.

In the nitride semiconductor light emitting device 11, the second portion 25b and the third portion 25c of the second inner semiconductor layer 25 may include the first optical guiding layer 43 and the second optical guiding layer 45, the band gap of the second optical guiding layer 45 may be greater than the band gap of the first optical guiding layer 43, and the second portion 25b and the third portion 25c of the second inner semiconductor layer 25 may further include a compositionally-graded region 47 in which the composition of materials of the second inner semiconductor layer 25 monotonically varies in a direction from the n-type cladding layer 23 to the p-type cladding layer 27. The composition of the first optical guiding layer 43 is substantially constant and the composition of the second optical guiding layer 45 is also substantially constant, whereas the In composition decreases in the compositionally-graded region 47.

The compositionally-graded region 47 connects the first optical guiding layer 43 with the second optical guiding layer 45 to create a refractive index profile in the second inner semiconductor layer, whereas due to the compositionally-graded region 47, the first optical guiding layer 43 and the second optical guiding layer 45 do not form any heterojunction. The second inner semiconductor layer 25, therefore, includes the first optical guiding layer 43 and the second optical guiding layer 45 whose refractive indexes are different from each other, but no dip is formed in the hole band of the second inner semiconductor layer 25.

Moreover, while the third portion 25c of the second inner semiconductor layer 25 includes the compositionally-graded region 47 in the nitride semiconductor light emitting device 11, a compositional gradient may be provided in a part of or the whole of the second inner semiconductor layer 25. The compositional gradient defines a refractive index profile in the second inner semiconductor layer 25. In addition, no dip is formed in the hole band.

In a preferred example, a thickness DG2 of the second inner semiconductor layer 25 may be set to 200 nm or more and 500 nm or less. The second inner semiconductor layer 25 may include a second optical guiding region which is provided between the p-type cladding layer 27 and the active layer 15. In addition, a thickness DG1 of the first inner semiconductor layer 21 may be set to 200 nm or more and 500 nm or less. The first inner semiconductor layer 21 includes a first optical guiding region which is provided between the n-type cladding layer 23 and the active layer 15.

In a long wavelength emission laser such as a green laser, a refractive index difference between an optical guiding layer and a cladding layer cannot be made increased because of wavelength dispersion in refractive index. A thick optical guiding layer such as that described above can be effectively used to compensate for the inability to increase the refractive index difference. However, when a total film thickness of an optical guiding layer exceeds 500 nm, a device series resistance in a semiconductor region from the active layer 15 to an anode electrode in the second inner semiconductor layer 25 becomes too large to ignore. This may cause an increase in drive voltage. In addition, in the first inner semiconductor layer 21, when a total film thickness of an optical guiding layer exceeds 500 nm, strain of the optical guiding layer may become significant and its crystallinity may become poor.

Figure 6:
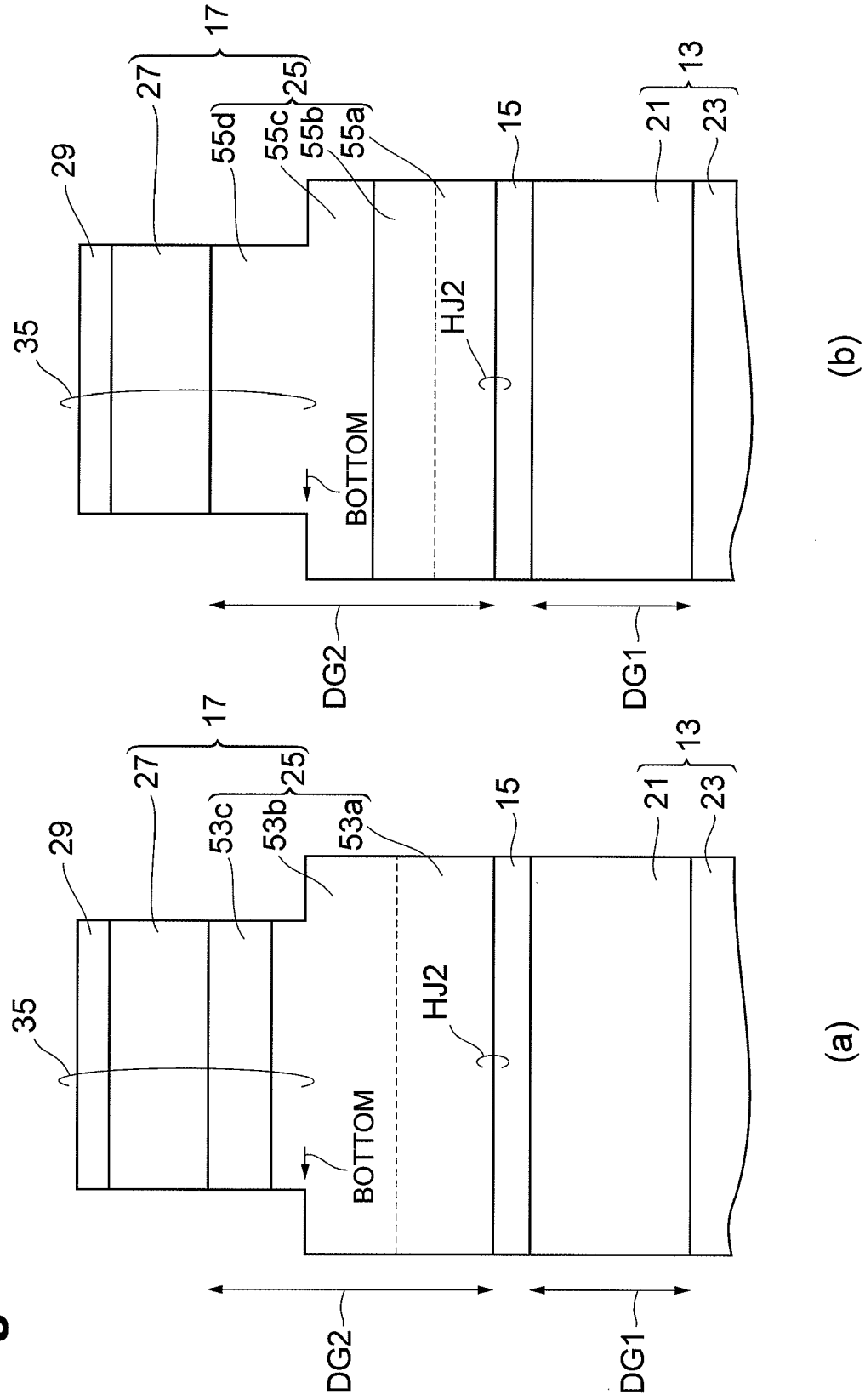
FIG. 6 is a schematic view showing a structure applicable to a ridge-type nitride semiconductor laser.

In a preferred example, as shown in Part (a) of FIG. 6, in the second inner semiconductor layer 25, the second optical guiding region may include an undoped $In_{X1}Ga_{1-X1}N$ layer ($0<X1<1$) 53a, a Mg-doped $In_{X1}Ga_{1-X1}N$ layer ($0<X1<1$) 53b, and a Mg-doped $In_{X2}Ga_{1-X2}N$ layer ($0\leq X2<X1<1$) 53c. The undoped layer 53a, the Mg-doped $In_{X1}Ga_{1-X1}N$ layer 53b, and the Mg-doped $In_{X2}Ga_{1-X2}N$ layer 53c are arranged in this order in a direction from the n-type cladding layer 23 toward the p-type cladding layer 27. The Mg-doped $In_{X2}Ga_{1-X2}N$ layer 53c layer forms a junction (the heterojunction HE shown in FIG. 1) with the Mg-doped $In_{X1}Ga_{1-X1}N$ layer 53b. The total thickness of the undoped $In_{X1}Ga_{1-X1}N$ layer 53a and the Mg-doped $In_{X1}Ga_{1-X1}N$ layer 53b is greater than a distance between the second heterojunction HJ2 and the bottom BOTTOM of the semiconductor ridge 35.

According to the nitride semiconductor light emitting device 11, the total thickness of the undoped $In_{X1}Ga_{1-X1}N$ layer 53a and the Mg-doped $In_{X1}Ga_{1-X1}N$ layer 53b is greater than a distance between the second heterojunction HJ2 and the bottom BOTTOM of the semiconductor ridge 35, and hence a junction (the heterojunction HJ5 shown in FIG. 1) between the Mg-doped $In_{X2}Ga_{1-X2}N$ layer 53c and the Mg-doped $In_{X1}Ga_{1-X1}N$ layer 53b is located in the semiconductor ridge 35. An optical guiding region can be constituted by a semiconductor layer with a high In composition and a semiconductor with a low In composition (including zero), and this structure can achieve a favorable crystalline quality without significantly deterioration of an optical confinement performance of an optical guiding region and can prevent the deterioration of crystalline quality of the cladding layer 27 and the contact layer 29 which are grown on the optical guiding region (53a to 53c).

In a preferred example, in the second inner semiconductor layer 25, as shown in Part (b) of FIG. 6, the second optical guiding region may include an undoped $In_{X1}Ga_{1-X1}N$ layer ($0<X1<1$) 55a, a Mg-doped $In_{X1}Ga_{1-X1}N$ layer ($0<X1<1$) 55b, a Mg-doped compositionally-graded $In_XGa_{1-X}N$ layer 55c, and a Mg-doped $In_{X2}Ga_{1-X2}N$ layer ($0\leq X2<X1<1$) 55d. The undoped layer 55a, the Mg-doped $In_{X1}Ga_{1-X1}N$ layer 55b, the Mg-doped compositionally-graded $In_XGa_{1-X}N$ layer 55c, and the Mg-doped $In_{X2}Ga_{1-X2}N$ layer 55d are arranged in this order in a direction from the n-type cladding layer 23 toward the p-type cladding layer 27. An In composition X in the Mg-doped compositionally-graded $In_XGa_{1-X}N$ layer is a composition X1 at an interface between the Mg-doped $In_{X1}Ga_{1-X1}N$ layer 55b and the Mg-doped compositionally-graded InGaN layer 55c. The In composition X in the Mg-doped compositionally-graded $In_XGa_{1-X}N$ layer is a composition X2 at an interface between the Mg-doped compositionally-graded InGaN layer 55c and the Mg-doped $In_{X2}Ga_{1-X2}N$ layer 55d. The In composition X in the Mg-doped compositionally-graded $In_XGa_{1-X}N$ layer monotonically changes from the composition X1 to the composition X2. The Mg-doped compositionally-graded $In_XGa_{1-X}N$ layer 55c is located between the bottom BOTTOM of the semiconductor ridge 35 and the second heterojunction HJ2.

According to the nitride semiconductor light emitting device 11, an In composition X in the Mg-doped compositionally-graded $In_XGa_{1-X}N$ layer 55c monotonically varies from a composition X1 to a composition X2. The Mg-doped compositionally-graded $In_XGa_{1-X}N$ layer 55c is located between the second heterojunction HJ2 and the bottom BOTTOM of the semiconductor ridge 35. Moreover, the In composition in the second inner semiconductor layer 25 may monotonically vary in a direction from the n-type cladding layer 23 toward the p-type cladding layer 27.

In a preferred example, in the second inner semiconductor layer 25, the second optical guiding region may include an undoped $In_XGa_{1-X}N$ layer (0<X<1) and a Mg-doped $In_XGa_{1-X}N$ layer (0<X<1) in the structure shown in Part (b) of FIG. 6 without including a compositionally-graded layer. The undoped $In_XGa_{1-X}N$ layer is provided between the active layer 15 and the Mg-doped $In_XGa_{1-X}N$ layer. A total film thickness of the undoped $In_XGa_{1-X}N$ layer and the Mg-doped $In_XGa_{1-X}N$ layer is greater than a distance between the second heterojunction HJ2 and the bottom BOTTOM of the semiconductor ridge 35. A junction between the undoped $In_XGa_{1-X}N$ layer and the Mg-doped $In_XGa_{1-X}N$ layer may be located between the second heterojunction HJ2 and the bottom BOTTOM of the semiconductor ridge 35. According to the nitride semiconductor light emitting device 11, since the undoped $In_XGa_{1-X}N$ layer and the Mg-doped $In_XGa_{1-X}N$ layer have the same In composition, these layers do not constitute a hetero-interface. In consideration of reduction in absorption loss, the $In_XGa_{1-X}N$ layer near the active layer 15 is favorably undoped. In addition, the undoped $In_XGa_{1-X}N$ layer which is provided between the active layer 15 and the Mg-doped $In_XGa_{1-X}N$ layer can prevent Mg from diffusing from the optical guiding layer to the active layer 15.

Figure 7:
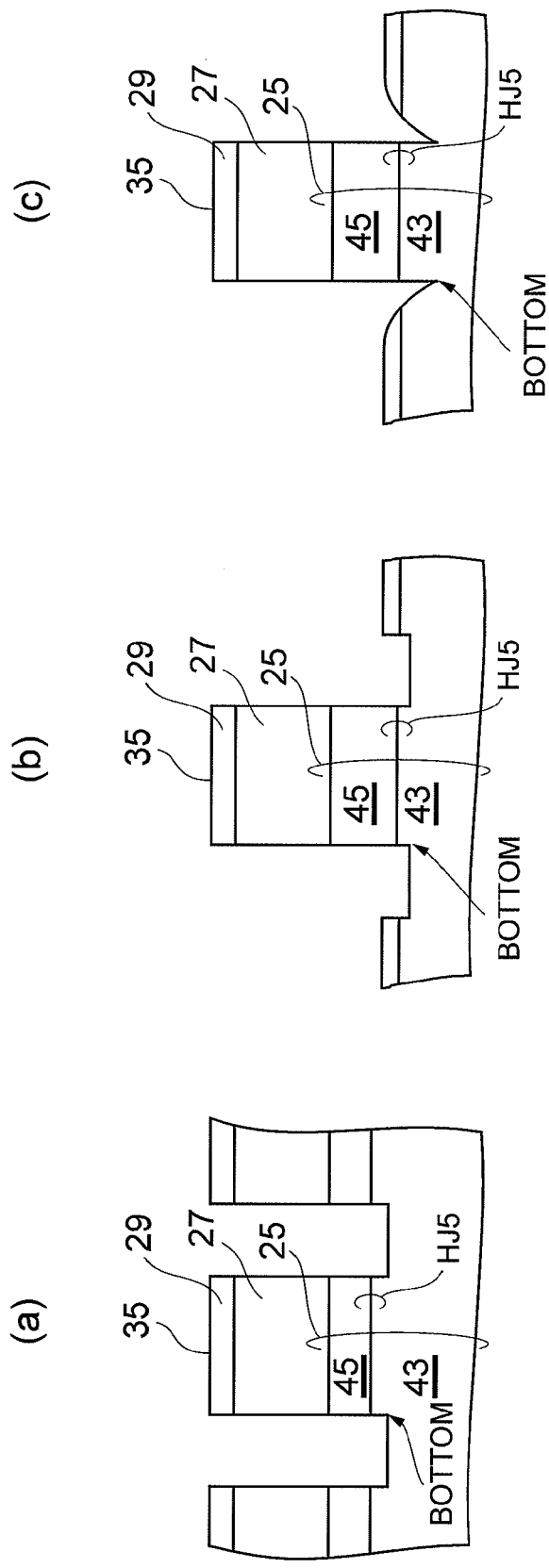
FIG. 7 is a diagram showing examples of shapes of a semiconductor ridge.

FIG. 7 is a diagram showing examples of shapes of a semiconductor ridge. As shown in FIG. 7, a semiconductor ridge may have shapes shown in Parts (a), (b), and (c) of FIG. 7 in addition to the shape shown in FIG. 1. In the shapes shown in Parts (a) to (c) of FIG. 7, a heterojunction HJ5 formed by two optical guiding layers 43 and 45 terminates at the side of the semiconductor ridge. The semiconductor ridge 35 in Part (a) of FIG. 7 is defined by a pair of trenches. The semiconductor ridge 35 in Part (b) of FIG. 7 is defined by a pair of shallow grooves which blocks the heterojunction HJ5 from extending laterally. The semiconductor ridge 35 in Part (c) of FIG. 7 is defined by a pair of tapered grooves which block the heterojunction HJ5 from extending. These ridge shapes can be formed by dry etching.

Figure 8:
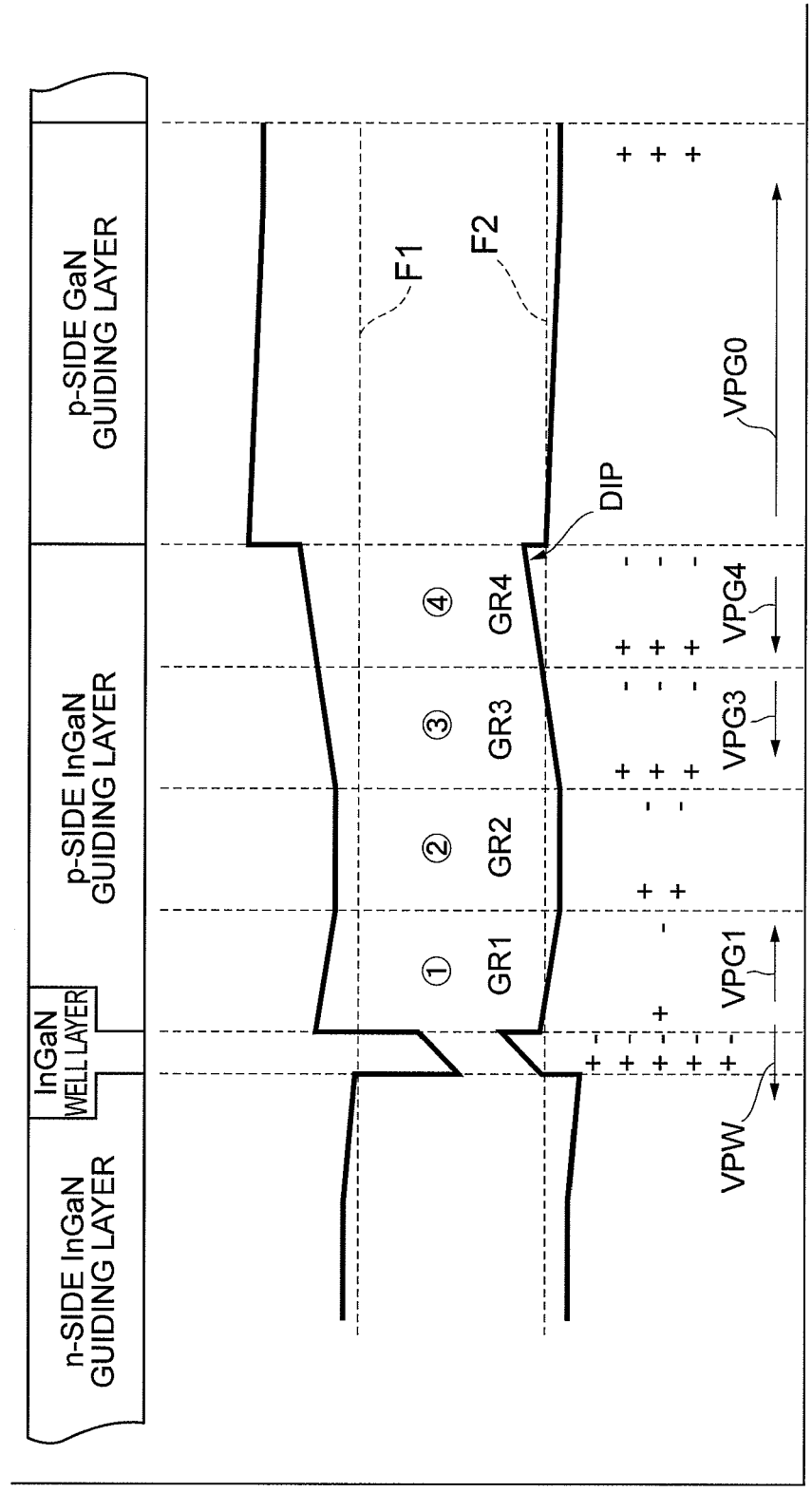
FIG. 8 is a diagram showing a relationship between piezoelectric polarization and a band diagram.

FIG. 8 is a diagram showing a relationship between piezoelectric polarizations and a band diagram. In FIG. 8, reference symbol F1 denotes a quasi-Fermi level in a conduction band and reference symbol F2 denotes a quasi-Fermi level in a valence band. An InGaN active layer is formed on a {20-21} plane GaN. When a gallium nitride semiconductor layer provided on this plane orientation is subjected to compressive stress in an in-plane direction, a negative piezoelectric polarization VPW is generated in the gallium nitride semiconductor layer. In FIG. 6, for example, an InGaN active layer is subjected to compressive stress in an in-plane direction. An InGaN optical guiding layer with an In composition that is smaller than an In composition of the InGaN active layer is formed on the active layer. On the InGaN active layer, strain of the InGaN guide layer is alleviated and the InGaN guide layer contains weak compressive stain. The InGaN optical guiding layer is divided into four regions, namely, GR1, GR2, GR3, and GR4. The region GR1 forms a heterojunction with the InGaN active layer. On the hetero-interface thereof, a small positive polarization is generated in the region GR1 depending on the negative polarization VPW generated in the InGaN active layer, and the InGaN region GR1 exhibits a positive polarization VPG1. Polarizations are generated in a negative direction in the regions GR3 and GR4 due to the compressive strain of the InGaN optical guiding layer, and the regions GR3 and GR4 exhibit a negative polarization VPG3 and a negative polarization VPG4, respectively. The region GR4 forms a heterojunction with the GaN optical guiding layer. Around the hetero-interface thereof, a polarization VPG0 in the GaN optical guiding layer is oriented in a direction opposite to the polarization in the InGaN optical guiding layer. In this manner, negative polarizations are generated in the regions GR3 and GR4 and a positive polarization is generated in the GaN optical guiding layer. Since the region GR4 of the InGaN optical guiding layer with a small band gap has a negative polarization VPG4, a dip DIP is formed in the hole band on the hetero-interface thereof. The region GR2 is located between the region GR1, which indicates a positive polarization VPG1, and the region GR3, which indicates a negative polarization VPG3, and is regarded as a polarization transition region.

Figure 9:
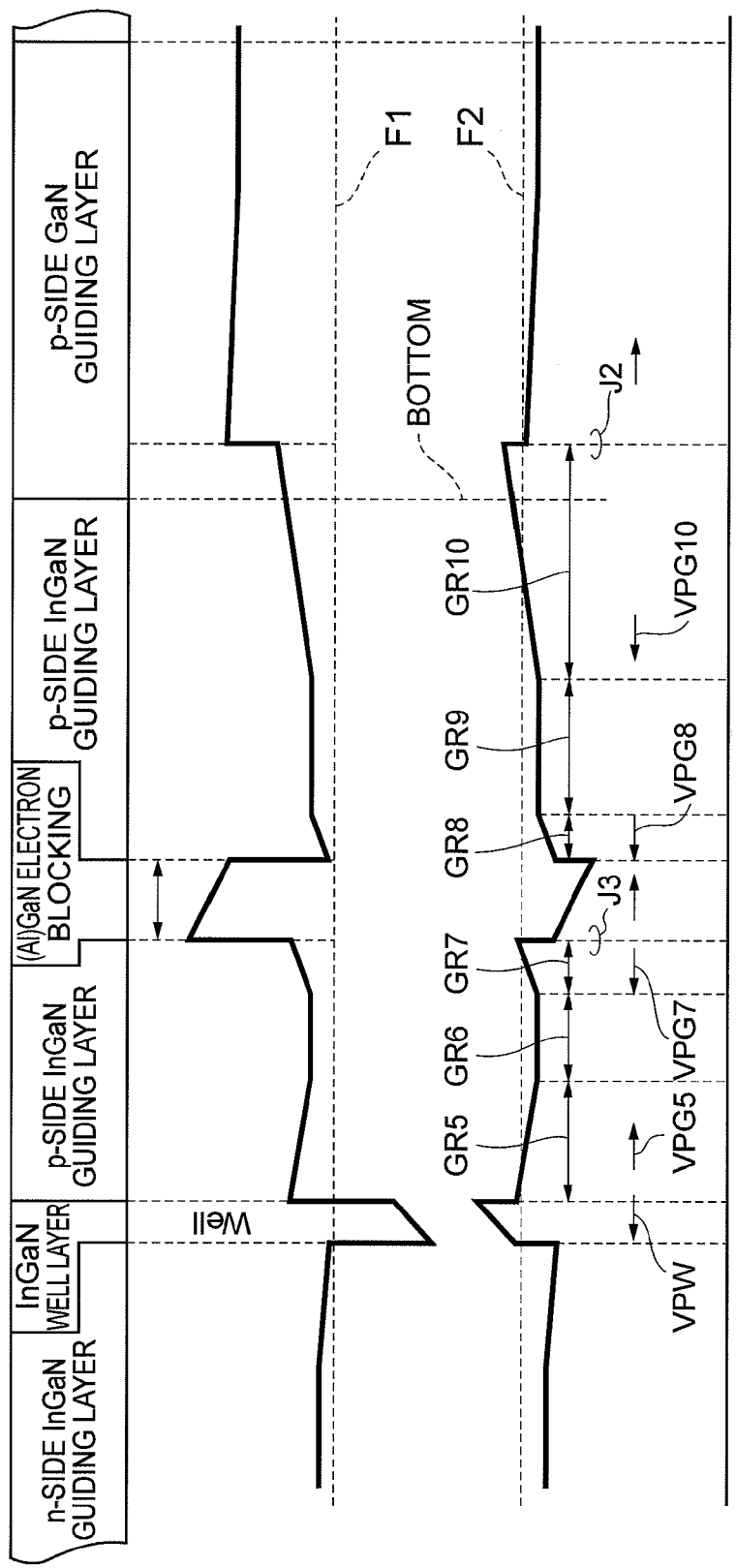
FIG. 9 is a diagram showing a relationship between piezoelectric polarization and a band diagram.

FIG. 9 is a diagram showing a relationship between piezoelectric polarizations and a band diagram. In FIG. 9, reference created F1 denotes a quasi-Fermi level in the conduction band and reference created F2 denotes a quasi-Fermi level in the valence band. In an epitaxial structure shown in FIG. 9, an electron blocking layer composed of AlGaN or GaN is provided in an optical guiding layer.

In this structure, an InGaN active layer includes a compressive strain in its in-plane direction whereas the electron blocking layer includes a tensile strain in its in-plane direction. When dividing an InGaN optical guiding layer between the InGaN active layer and the electron blocking layer into three regions GR5, GR6, and GR7, the region GR5 has a positive polarization VPG5, the region GR7 has a negative polarization VPG7, and a polarization of the region GR6 transitions between the region GR5 and the region GR7.

In addition, when dividing an InGaN optical guiding layer between a GaN optical guiding layer and the electron blocking layer into three regions GR8, GR9, and GR10, the region GR8 is subjected to stress from the electron blocking layer and has a slightly large negative polarization VPG8. The region GR10 forms a junction with the GaN optical guiding layer and has a small negative polarization VPG10. A polarization of the region GR9 transitions between the region GR8 and the region GR10.

In this structure, two-dimensional hole gas is produced at the heterojunctions J2 and J3. Since the heterojunction J2 is provided in a semiconductor ridge, the heterojunction J2 does not contribute to a lateral carrier spreading. Although the heterojunction J3 is provided outside of the semiconductor ridge, an electron blocking layer pertaining to the heterojunction J3 is located within around 80 nm from the active layer and hence the heterojunction J3 hardly contributes to the carrier spreading in the lateral direction. The heterojunction J3 is favorably separated apart from the active layer by a distance of 10 nm or greater. Accordingly, when a p-type dopant is added to an electron blocking layer, a possible diffusion of the p-type dopant does not affect the InGaN well layer.

According to the present embodiment, a nitride semiconductor light emitting device can be provided which has a structure capable of reducing a lateral spreading of carriers originating from a semiconductor ridge.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A nitride semiconductor light emitting device comprising:
   a first group III nitride semiconductor region including an n-type cladding layer and a first inner semiconductor layer;
   an active layer provided on the first inner semiconductor layer in the first group III nitride semiconductor region;
   a second group III nitride semiconductor region including a p-type cladding layer and a second inner semiconductor layer, the second group III nitride semiconductor region being provided on the active layer; and
   an electrode provided on the second group III nitride semiconductor region,
   the first group III nitride semiconductor region, the active layer, and the second group III nitride semiconductor region being arranged in order along a given stacking axis;
   the first inner semiconductor layer being provided between the active layer and the n-type cladding layer;
   the second inner semiconductor layer being provided between the active layer and the p-type cladding layer;
   the first inner semiconductor layer, the active layer, and the second inner semiconductor layer constituting a core region;
   the n-type cladding layer, the core region, and the p-type cladding layer constituting an optical waveguide structure;
   the active layer and the first inner semiconductor layer of the first group III nitride semiconductor region forming a first heterojunction;
   the n-type cladding layer comprising a group III nitride semiconductor;
   the first heterojunction is inclined with respect to a reference plane at an inclination angle of greater than zero, the reference plane extending along a c-plane of the group III nitride semiconductor of the n-type cladding layer;
   the active layer including a well layer, the well layer comprising a gallium nitride semiconductor, the well layer including a compressive strain, a piezoelectric polarization of the well layer being oriented in a direction from the p-type cladding layer toward the n-type cladding layer, and the well layer including an InGaN layer;
   the well layer of the active layer and the second inner semiconductor layer of the second group III nitride semiconductor region forming a second heterojunction;
   the second group III nitride semiconductor region including a semiconductor ridge;
   the semiconductor ridge including a third heterojunction between the second inner semiconductor layer and the p-type cladding layer;
   the second inner semiconductor layer includes a first portion, a second portion and a third portion between the first portion and the second portion, the first portion forms the second heterojunction with the well layer of the active layer, the second portion from the third heterojunction to a bottom of the semiconductor ridge, and the third portion being provided between the first portion and the second portion;
   the first portion, the third portion and the second portion being arranged in order along the stacking axis; and
   a distance between the bottom of the semiconductor ridge and the second heterojunction being 200 nm or less.

2. The nitride semiconductor light emitting device according to claim 1, wherein
   a band gap of the p-type cladding layer is larger than a band gap of the second portion of the second inner semiconductor layer at the third heterojunction, and
   the inclination angle is within a range of 50 degrees or more and 80 degrees or less or a range of 130 degrees or more and 170 degrees or less.

3. The nitride semiconductor light emitting device according to claim 1, wherein
   the first portion of the second inner semiconductor layer is located within a distance of 80 nm from the second heterojunction and the distance is defined in a direction of the stacking axis, and
   the third portion of the second inner semiconductor layer includes no heterojunction.

4. The nitride semiconductor light emitting device according to claim 1, wherein
   the second inner semiconductor layer includes a first optical guiding layer and a second optical guiding layer,
   material of the first optical guiding layer is different from that of the second optical guiding layer, and
   the second portion of the second inner semiconductor layer includes a junction constituted by the first optical guiding layer and the second optical guiding layer.

5. The nitride semiconductor light emitting device according to claim 1, wherein the third portion of the second inner semiconductor layer includes a compositionally-graded region, and a composition of material of the second inner semiconductor layer in the compositionally-graded region monotonically varies in a direction from the n-type cladding layer toward the p-type cladding layer.

6. The nitride semiconductor light emitting device according to claim 1, wherein
   the second portion and third portion of the second inner semiconductor layer include a first optical guiding layer and a second optical guiding layer,
   a band gap of the second optical guiding layer is greater than a band gap of the first optical guiding layer,
   the second portion and third portion of the second inner semiconductor layer further include a compositionally-graded region, and a composition of materials of the compositionally-graded region in the second inner semiconductor layer monotonically varies in a direction from the n-type cladding layer toward the p-type cladding layer,
   the first optical guiding layer has a composition and the composition of the first optical guiding layer is substantially constant, and
   the second optical guiding layer has a composition, and the composition of the second optical guiding layer is substantially constant.

7. The nitride semiconductor light emitting device according to claim 1, wherein the first portion of the second inner semiconductor layer includes an electron blocking layer.

8. The nitride semiconductor light emitting device according to claim 7, wherein
   the first portion includes an optical guiding layer and a fourth heterojunction, the an optical guiding layer is provided between the electron blocking layer and the active layer, and the optical guiding layer and the electron blocking layer forms the fourth heterojunction, and
   the fourth heterojunction is separated from the second heterojunction by a distance of 10 nm or more and the distance is defined in a direction of the stacking axis.

9. The nitride semiconductor light emitting device according to claim 1, further comprising
a substrate having a semipolar primary surface, the semipolar primary surface comprising a group III nitride semiconductor,
wherein an angle formed by the semipolar primary surface and the reference plane is within a range of 50 degrees or more and 80 degrees or less or a range of 130 degrees or more and 170 degrees or less, and
the first group III nitride semiconductor region, the active layer, and the second group III nitride semiconductor region are provided on the semipolar primary surface.

10. The nitride semiconductor light emitting device according to claim 9, wherein the substrate is made of GaN.

11. The nitride semiconductor light emitting device according to claim 1, wherein
a thickness of the first inner semiconductor layer is 200 nm or more and 500 nm or less,
the first inner semiconductor layer includes a first optical guiding region provided between the n-type cladding layer and the active layer,
a thickness of the second inner semiconductor layer is 200 nm or more and 500 nm or less, and
the second inner semiconductor layer includes a second optical guiding region provided between the p-type cladding layer and the active layer.

12. The nitride semiconductor light emitting device according to claim 1, wherein
the second inner semiconductor layer includes a second optical guiding region,
the second optical guiding region includes an undoped $In_XGa_{1-X}N$ layer ($0<X<1$) and a Mg-doped $In_XGa_{1-X}N$ layer ($0<X<1$),
the undoped $In_XGa_{1-X}N$ layer is provided between the active layer and the Mg-doped $In_XGa_{1-X}N$ layer,
a total film thickness of the undoped $In_XGa_{1-X}N$ layer and the Mg-doped $In_XGa_{1-X}N$ layer is greater than a distance between the second heterojunction and the bottom of the semiconductor ridge, and
a junction between the undoped $In_XGa_{1-X}N$ layer and the Mg-doped $In_XGa_{1-X}N$ layer is located between the second heterojunction and the bottom of the semiconductor ridge.

13. The nitride semiconductor light emitting device according to claim 1, wherein
the second inner semiconductor layer includes a second optical guiding region,
the second optical guiding region includes an undoped $In_{X1}Ga_{1-X1}N$ layer ($0<X1<1$), a Mg-doped $In_{X1}Ga_{1-X1}N$ layer ($0<X1<1$), and a Mg-doped $In_{X2}Ga_{1-X2}N$ layer ($0\leq X2<X1<1$),
the undoped $In_{X1}Ga_{1-X1}N$ layer, the Mg-doped $In_{X1}Ga_{1-X1}N$ layer, and the Mg-doped $In_{X2}Ga_{1-X2}N$ layer are arranged in order in a direction from the n-type cladding layer toward the p-type cladding layer,
the Mg-doped $In_{X2}Ga_{1-X2}N$ layer forms a junction with the Mg-doped $In_{X1}Ga_{1-X1}N$ layer, and
a total thickness of the undoped $In_{X1}Ga_{1-X1}N$ layer and the Mg-doped $In_{X1}Ga_{1-X1}N$ layer is greater than a distance between the second heterojunction and the bottom of the semiconductor ridge.

14. The nitride semiconductor light emitting device according to claim 1, wherein
the second inner semiconductor layer includes a second optical guiding region,
the second optical guiding region includes an undoped $In_{X1}Ga_{1-X1}N$ layer ($0<X1<1$), a Mg-doped $In_{X1}Ga_{1-X1}N$ layer ($0<X1<1$), a Mg-doped compositionally-graded $In_XGa_{1-X}N$ layer, and a Mg-doped $In_{X2}Ga_{1-X2}N$ layer ($0\leq X2<X1<1$),
the undoped $In_{X1}Ga_{1-X1}N$ layer, the Mg-doped $In_{X1}Ga_{1-X1}N$ layer, the Mg-doped compositionally-graded $In_XGa_{1-X}N$ layer, and the Mg-doped $In_{X2}Ga_{1-X2}N$ layer are arranged in this order in a direction from the n-type cladding layer toward the p-type cladding layer,
an In composition X of the Mg-doped compositionally-graded $In_XGa_{1-X}N$ layer has a composition X1 at an interface between the Mg-doped $In_{X1}Ga_{1-X1}N$ layer and the Mg-doped compositionally-graded $In_XGa_{1-X}N$ layer, the In composition X has a composition X2 at an interface between the Mg-doped compositionally-graded $In_XGa_{1-X}N$ layer and the Mg-doped $In_{X2}Ga_{1-X2}N$ layer, and the In composition X monotonically changes from the composition X1 to the composition X2, and
the Mg-doped compositionally-graded $In_XGa_{1-X}N$ layer is located between the second heterojunction and the bottom of the semiconductor ridge.

15. The nitride semiconductor light emitting device according to claim 1, wherein the angle of inclination is within a range of not less than 63 degrees and not more than 80 degrees.

16. The nitride semiconductor light emitting device according to claim 1, wherein the active layer is provided so as to generate an emission of an optical spectrum having a lasing peak wavelength in a range of 500 nm or more and 550 nm or less.

17. The nitride semiconductor light emitting device according to claim 1, wherein, in the active layer, the well layer forms a junction with the second inner semiconductor layer.

18. A nitride semiconductor light emitting device comprising:
a first group III nitride semiconductor region including an n-type cladding layer and a first inner semiconductor layer;
an active layer provided on the first inner semiconductor layer of the first group III nitride semiconductor region;
a second group III nitride semiconductor region including a p-type cladding layer and a second inner semiconductor layer, the second group III nitride semiconductor region being provided on the active layer; and
an electrode provided on the second group III nitride semiconductor region,
the first group III nitride semiconductor region, the active layer, and the second group III nitride semiconductor region being arranged in order along a given stacking axis;
the first inner semiconductor layer being provided between the active layer and the n-type cladding layer;
the second inner semiconductor layer being provided between the active layer and the p-type cladding layer;
the active layer and the first inner semiconductor layer of the first group III nitride semiconductor region constituting a first heterojunction;
the n-type cladding layer comprising a group III nitride semiconductor;
the first heterojunction being tilted at an angle of inclination with respect to a reference plane that extends along a c-plane of the group III nitride semiconductor of the n-type cladding layer, the angle of inclination being greater than zero;
the active layer including a well layer, the well layer comprising a gallium nitride semiconductor, the well layer including a compressive strain, a piezoelectric polarization of the well layer being oriented in a direction from the p-type cladding layer toward the n-type cladding layer;

the active layer and the second inner semiconductor layer of the second group III nitride semiconductor region constituting a second heterojunction;

the second group III nitride semiconductor region including a semiconductor ridge;

the semiconductor ridge including a third heterojunction between the second inner semiconductor layer and the p-type cladding layer;

the second inner semiconductor layer including a first portion, a second portion and a third portion, the first portion being within 80 nm from the second heterojunction as defined in a direction of the stacking axis, the first portion forming the second heterojunction with the active layer, the second portion being a region from the third heterojunction to a bottom of the semiconductor ridge, and the third portion being provided between the first portion and the second portion;

the first portion, the third portion, and the second portion being arranged in order along the stacking axis; and the third portion of the second inner semiconductor layer including no heterojunction.

19. A nitride semiconductor light emitting device comprising:

a first group III nitride semiconductor region including an n-type cladding layer and a first inner semiconductor layer;

an active layer provided on the first inner semiconductor layer in the first group III nitride semiconductor region;

a second group III nitride semiconductor region including a p-type cladding layer and a second inner semiconductor layer, the second group III nitride semiconductor region being provided on the active layer; and an electrode provided on the second group III nitride semiconductor region, the first group III nitride semiconductor region, the active layer, and the second group III nitride semiconductor region being arranged in order along a given stacking axis;

the first inner semiconductor layer being provided between the active layer and the n-type cladding layer;

the second inner semiconductor layer being provided between the active layer and the p-type cladding layer;

the active layer and the first inner semiconductor layer in the first group III nitride semiconductor region constituting a first heterojunction;

the n-type cladding layer comprising a group III nitride semiconductor;

the first heterojunction being tilted at an angle of inclination with respect to a reference plane, the reference plane extending along a c-plane of the group III nitride semiconductor of the n-type cladding layer, and the angle of inclination being greater than zero;

the active layer including a well layer, the well layer comprising a gallium nitride semiconductor and including a compressive strain, a piezoelectric polarization of the well layer being oriented in a direction from the p-type cladding layer toward the n-type cladding layer;

the active layer and the second inner semiconductor layer in the second group III nitride semiconductor region constituting a second heterojunction;

the second group III nitride semiconductor region including a semiconductor ridge;

the semiconductor ridge including a third heterojunction between the second inner semiconductor layer and the p-type cladding layer;

the second inner semiconductor layer including a first portion, a second portion and a third portion between the first portion and the second portion, the first portion being within 80 nm from the second heterojunction as defined in a direction of the stacking axis, the first portion forming the second heterojunction with the active layer, the second portion being a region from the third heterojunction to a bottom of the semiconductor ridge, and the third portion being provided between the first portion and the second portion;

the first portion, the third portion, and the second portion being arranged in order along the stacking axis;

the third portion of the second inner semiconductor layer including no heterojunction;

the second inner semiconductor layer including a first optical guiding layer and a second optical guiding layer;

the first optical guiding layer having a band gap greater than a band gap of the second optical guiding layer;

the first optical guiding layer being provided between the p-type cladding layer and the second optical guiding layer; and the first optical guiding layer forming a heterojunction with the second optical guiding layer in the second portion.

20. A nitride semiconductor light emitting device comprising:

a first group III nitride semiconductor region including an n-type cladding layer and a first inner semiconductor layer;

an active layer provided on the first inner semiconductor layer of the first group III nitride semiconductor region;

a second group III nitride semiconductor region including a p-type cladding layer and a second inner semiconductor layer, the second group III nitride semiconductor region being provided on the active layer; and an electrode provided on the second group III nitride semiconductor region, the first group III nitride semiconductor region, the active layer, and the second group III nitride semiconductor region being arranged in order along a given stacking axis;

the first inner semiconductor layer being provided between the active layer and the n-type cladding layer;

the second inner semiconductor layer being provided between the active layer and the p-type cladding layer;

the active layer and the first inner semiconductor layer of the first group III nitride semiconductor region constituting a first heterojunction;

the n-type cladding layer comprising a group III nitride semiconductor;

the first heterojunction being tilted at an angle of inclination with respect to a reference plane, the reference plane extending along a c-plane of the group III nitride semiconductor of the n-type cladding layer, and the angle of inclination being greater than zero;

the active layer including a well layer, the well layer comprising a gallium nitride semiconductor and including a compressive strain, a piezoelectric polarization of the well layer being oriented in a direction from the p-type cladding layer toward the n-type cladding layer;

the active layer and the second inner semiconductor layer of the second group III nitride semiconductor region constituting a second heterojunction;

the second group III nitride semiconductor region including a semiconductor ridge;

the semiconductor ridge including a third heterojunction between the second inner semiconductor layer and the p-type cladding layer;

the semiconductor ridge including a third heterojunction between the second inner semiconductor layer and the p-type cladding layer;

the second inner semiconductor layer including a first portion, a second portion and a third portion between the first portion and the second portion, the first portion being within 80 nm from the second heterojunction as defined in a direction of the stacking axis, the first portion forming the second heterojunction with the active layer, the second portion being a region from the third heterojunction to a bottom of the semiconductor ridge, and the third portion being provided between the first portion and the second portion;

the first portion, the third portion, and the second portion being arranged in this order along the stacking axis;

the third portion of the second inner semiconductor layer including no heterojunction; and the third portion of the second inner semiconductor layer including a compositionally-graded region, and a composition of material of the second inner semiconductor layer in the compositionally-graded region monotonically varying in a direction from the n-type cladding layer toward the p-type cladding layer.

\* \* \* \* \*